US008125818B2

(12) United States Patent
Muraoka et al.

(10) Patent No.: US 8,125,818 B2
(45) Date of Patent: Feb. 28, 2012

(54) METHOD OF PROGRAMMING VARIABLE RESISTANCE ELEMENT AND VARIABLE RESISTANCE MEMORY DEVICE USING THE SAME

(75) Inventors: Shunsaku Muraoka, Osaka (JP); Takeshi Takagi, Kyoto (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 12/918,874

(22) PCT Filed: Feb. 25, 2009

(86) PCT No.: PCT/JP2009/000821
§ 371 (c)(1),
(2), (4) Date: Aug. 23, 2010

(87) PCT Pub. No.: WO2009/107370
PCT Pub. Date: Sep. 3, 2009

(65) Prior Publication Data
US 2011/0002158 A1 Jan. 6, 2011

(30) Foreign Application Priority Data
Feb. 25, 2008 (JP) .................................. 2008-042465

(51) Int. Cl.
*G11C 11/00* (2006.01)
(52) U.S. Cl. ............... 365/148; 365/185.19; 365/185.22
(58) Field of Classification Search .................. 365/148, 365/185.19, 185.22
See application file for complete search history.

(56) References Cited

U.S. PATENT DOCUMENTS

| 6,204,139 B1 | 3/2001 | Liu et al. |
| 6,815,744 B1 | 11/2004 | Beck et al. |
| 6,992,920 B2 * | 1/2006 | Tamai et al. ............. 365/189.15 |
| 7,558,099 B2 * | 7/2009 | Morimoto ..................... 365/148 |
| 8,059,448 B2 * | 11/2011 | Tanigami et al. ............. 365/148 |

(Continued)

FOREIGN PATENT DOCUMENTS

JP 2002-537627 11/2002
(Continued)

OTHER PUBLICATIONS

International Search Report issued May 26, 2009 in International (PCT) Application No. PCT/JP2009/000821.

*Primary Examiner* — Connie Yoha
(74) *Attorney, Agent, or Firm* — Wenderoth, Lind & Ponack, L.L.P.

(57) ABSTRACT

A method of programming a variable resistance element to be operated with stability and at a high speed is provided. The method programs a nonvolatile variable resistance element (10) including a variable resistance layer (3), which changes between a high resistance state and a low resistance state depending on a polarity of an applied electric pulse, and a lower electrode (2) and an upper electrode (4). The method includes: writing steps (S11) and (S15) to cause the variable resistance layer (3) to change from the low resistance state to the high resistance state by applying a write voltage pulse; and an erasing step (S13) to cause the variable resistance layer (3) to change from the high resistance state to the low resistance state. In the writing steps, a write voltage pulse is applied between the electrodes so as to satisfy |Vw1|>|Vw| where Vw1 represents a voltage value of the write voltage pulse in the first writing step (S11) after manufacturing the variable resistance element (10) and Vw represents a voltage value of the write voltage pulse in writing steps after the first writing step (S15) after manufacturing the variable resistance element (10).

11 Claims, 12 Drawing Sheets

U.S. PATENT DOCUMENTS

| | | |
|---|---|---|
| 2004/0174739 A1 | 9/2004 | Morimoto et al. |
| 2004/0245557 A1 | 12/2004 | Seo et al. |
| 2004/0264244 A1 | 12/2004 | Morimoto et al. |
| 2005/0145910 A1 | 7/2005 | Tamai et al. |
| 2007/0114587 A1 | 5/2007 | Seo et al. |
| 2007/0115714 A1 | 5/2007 | Muraoka et al. |
| 2007/0195581 A1 | 8/2007 | Morimoto |
| 2008/0048165 A1 | 2/2008 | Miyazawa |
| 2011/0080770 A1* | 4/2011 | Muraoka et al. ............. 365/148 |

FOREIGN PATENT DOCUMENTS

| | | |
|---|---|---|
| JP | 2004-185723 | 7/2004 |
| JP | 2004-363604 | 12/2004 |
| JP | 2005-025914 | 1/2005 |
| JP | 2005-167064 | 6/2005 |
| JP | 2007-004849 | 1/2007 |
| JP | 2007-004873 | 1/2007 |
| JP | 2007-515026 | 6/2007 |
| JP | 2007-180176 | 7/2007 |
| JP | 2007-188559 | 7/2007 |
| JP | 2007-193878 | 8/2007 |
| JP | 2007-226883 | 9/2007 |
| JP | 2008-028228 | 2/2008 |
| WO | 00/49659 | 8/2000 |

* cited by examiner

Erasing Voltage : Ve = +1.5 V / 100 ns
Write Voltage : Vw = −1.8 V / 100 ns

|Vw1| > |Vw|

○ — Good Endurance

✕ — Not Good Endurance $(|Vw1| > |Vw|)$

METHOD OF PROGRAMMING VARIABLE RESISTANCE ELEMENT AND VARIABLE RESISTANCE MEMORY DEVICE USING THE SAME

TECHNICAL FIELD

The present invention relates to methods of programming a variable resistance element. More particularly, the present invention relates to a method of programming a variable resistance element having electrical resistance that varies depending on applied electric pulses, and a variable resistance memory device using the method.

BACKGROUND ART

With the development of digital technologies regarding electronic devices, in order to store data such as images, requirements arise for a larger capacity of nonvolatile variable resistance elements, reduction of power consumption for writing, a higher speed for a writing/reading time, a longer duration, and the like. It is considered that current attempt at more microfabricated flash memories using floating gates has a limit to satisfy such requirements.

One conventional technology having a possibility of satisfying the requirements is disclosed to provide a nonvolatile variable resistance element made of a perovskite material (for example, Pr(1−x)CaxMnO$_3$[PCMO], LaSrMnO$_3$[LSMO], GdBaCoXOY[GBCO], and the like) (refer to Patent Reference 1). In this technology, the perovskite material receives electric pulses (voltages having waveforms with short durations) having different polarities in order to increase or decrease a resistance value of the material, which enables the nonvolatile variable resistance element to memorize data in association with the varying resistance value.

There is another conventional technology for switching a resistance value by using electric pulses having the same polarity. In the technology, a nonvolatile variable resistance element exploits the characteristics that a resistance value of a film made of a transition metal oxide (NiO, V$_2$O, ZnO, Nb$_2$O$_5$, TiO$_2$, WO$_3$, or CoO) is varied when electric pulses having different pulse widths are applied to the film (refer to Patent Reference 2). There is also a variable resistance element made of a transition metal oxide film in a structure of a crosspoint memory array using diodes.

[Patent Reference 1] U.S. Pat. No. 6,204,139, Specification
[Patent Reference 2] Japanese Unexamined Patent Application Publication No. 2004-363604

DISCLOSURE OF INVENTION

Problems that Invention is to Solve

However, it is known that the conventional technology disclosed in Patent Reference 1 has a problem of insufficiency in operation stability and reproducibility. In addition, crystallization of an oxide crystal having a perovskite structure such as Pr$_{0.7}$Ca$_{0.3}$MnO$_3$ needs a high temperature generally from 650° C. to 850° C. Therefore, if the crystallization is used to manufacturing a semiconductor device, other materials are deteriorated.

The conventional technology disclosed in Patent Reference 2 also has a problem of a great difficulty in achieving high-speed operations because a pulse width of a voltage for changing a resistance value from a low resistance state to a high resistance state is considerably long that is 1 msec or more. Therefore, variable resistance elements with stable and high-speed operations are desired.

A primary object of the present invention is to provide a method of programming a variable resistance element to perform stable and high-speed operations, and a variable resistance memory device using the method.

A secondary object of the present invention is to provide a method of programming a variable resistance element, which is capable of being manufactured at low temperature, to achieve the stable and high-speed operations, and a variable resistance memory device using the method.

Means to Solve the Problems

Materials of a variable resistance layer in a variable resistance element and a method of programming the variable resistance element have been thoroughly examined. When a variable resistance layer comprises a tantalum oxide represented by TaO$_x$, where x is within a predetermined range, and a predetermined method is employed to program the variable resistance element, highly-stable resistance variation can be achieved at a high speed. In addition, the variable resistance layer having the above structure can be manufactured at very low temperature (for example, at ambient temperature).

In accordance with an aspect of the present invention for achieving the primary object, there is provided a method of programming a variable resistance element, the variable resistance element being nonvolatile and including a variable resistance layer and first and second electrodes connected to the variable resistance layer, and the variable resistance layer comprising a metal oxide and changing between a high resistance state and a low resistance state depending on a polarity of an applied electric pulse, the method including: writing to cause the variable resistance layer to change from the low resistance state to the high resistance state, by applying a write voltage pulse with a first polarity between the first and second electrodes; and erasing to cause the variable resistance layer to change from the high resistance state to the low resistance state, by applying an erasing voltage pulse with a second polarity different from the first polarity between the first and second electrodes, wherein the writing includes applying the write voltage pulse between the first and second electrodes so as to satisfy |Vw1|>|Vw| where Vw1 represents a voltage value of the write voltage pulse in a first writing step after manufacturing the variable resistance element and Vw represents a voltage value of the write voltage pulses in writing steps after the first writing step after manufacturing the variable resistance element.

It is preferable that in the first writing step, a resistance value of the variable resistance layer changes from an initial resistance value to a first resistance value higher than the initial resistance value, in the writing steps after the first writing step, the resistance value of the variable resistance layer changes from a second resistance value to a third resistance value higher than the second resistance value, and that the initial resistance value is not higher than the second resistance value.

Thereby, a voltage pulse applied in the first writing step after manufacturing the variable resistance element has a voltage value having an absolute value higher than that of a voltage value of voltage pulses applied in writing steps after the first writing step. As a result, the variable resistance element changes between the low resistance state and the high resistance state with stability and at a high speed.

Here, the initial resistance value refers to a resistance value of the variable resistance layer in a state (initial state) where any write voltage pulse has not yet been applied to the variable resistance layer in the variable resistance element after manufacturing the variable resistance element. Moreover, a voltage pulse applied to the variable resistance element in the initial state is called an initial write voltage pulse.

It is further preferable that the erasing includes applying the erasing voltage pulse with a voltage value Ve between the first and second electrodes so as to satisfy $|Vw| \geq |Ve|$.

It is still further preferable that the writing further includes (i) determining a resistance state of the variable resistance layer after each of the writing steps, and (ii) applying a re-write voltage pulse with a voltage value Vw2 between the first and second electrodes so as to satisfy $|Vw2|>|Vw|$ when the determining is made that the variable resistance layer remains in the low resistance state.

Thereby, if the variable resistance layer remains in the low resistance state after any of the writing steps, the re-write voltage pulse with a voltage value having an absolute value higher than that of a voltage value of a voltage pulse applied in the general subsequent writing steps is applied. As a result, writing for changing the low resistance state to the high resistance state is performed surely at a high speed.

It is still further preferable that the erasing includes applying the erasing voltage pulse between the first and second electrodes so as to satisfy $|Vw| \geq |Ve|$ after the application of the re-write voltage pulse.

It is still further preferable that the writing includes applying the re-write voltage pulse between the first and second electrodes so as to satisfy Vw1=Vw2.

It is still further preferable that the metal oxide is a tantalum oxide represented by a chemical formula of $TaO_x$ where $0.8 \leq x \leq 1.9$. Thereby, it is possible to provide the method of programming the variable resistance element, which is capable of being manufactured at low temperature, to achieve the stable and high-speed operations. As a result, the secondary object of the present invention can be achieved.

In accordance with another aspect of the present invention for achieving the primary object, there is provided a variable resistance memory device including: a variable resistance element that is nonvolatile; and a voltage pulse application circuit, wherein the variable resistance element includes: a variable resistance layer comprising a metal oxide and changing between a high resistance state and a low resistance state depending on a polarity of an applied electric pulse; and first and second electrodes connected to the variable resistance layer, and the voltage pulse application circuit includes: a writing unit configured to cause the variable resistance layer to change from the low resistance state to the high resistance state, by applying a write voltage pulse with a first polarity between the first and second electrodes; and an erasing unit configured to cause the variable resistance layer to change from the high resistance state the low resistance state, by applying an erasing voltage pulse with a second polarity different from the first polarity between the first and second electrode, wherein the writing unit is further configured to apply the write voltage pulse between the first and second electrodes so as to satisfy $|Vw1|>|Vw|$ where Vw1 represents a voltage value of the write voltage pulse in a first writing step after manufacturing the variable resistance element and Vw represents a voltage value of the write voltage pulse in writing steps after the first writing step after manufacturing the variable resistance element.

It is preferable that the writing unit is further configured (i) in the first writing step to change a resistance value of the variable resistance layer from an initial resistance value to a first resistance value higher than the initial resistance value, and (ii) in writing steps after the first writing step to change the resistance value of the variable resistance layer from a second resistance value to a third resistance value higher than the second resistance value, and the initial resistance value is lower than the second resistance value.

Thereby, a voltage pulse applied in the first writing step after manufacturing the variable resistance element has a voltage value having an absolute value higher than that of a voltage value of a voltage pulse applied in the writing steps after the first writing step. As a result, the variable resistance element changes between the low resistance state and the high resistance state with stability and at a high speed.

It is further preferable that the erasing unit is further configured to apply the erasing voltage pulse with a voltage value Ve between the first and second electrodes so as to satisfy $..Vw| \geq |Ve|$.

It is still further preferable that the writing unit is further configured to (i) determine a resistance state of the variable resistance layer after each of the writing steps, and (ii) apply a re-write voltage pulse with a voltage value Vw2 between the first and second electrodes so as to satisfy $|Vw2|>|Vw|$ when the determining is made that the variable resistance layer remains in the low resistance state.

Thereby, if the variable resistance layer remains in the low resistance state after any of the writing steps, the re-write voltage pulse with a voltage value having an absolute value higher than that of a voltage value of a voltage pulse applied in the general subsequent writing steps is applied. As a result, writing for changing the low resistance state to the high resistance state is performed surely at a high speed.

It is still further preferable that the erasing unit is further configured to apply the erasing voltage pulse between the first and second electrodes so as to satisfy $|Vw| \geq |Ve|$ after the application of the re-write voltage pulse.

It is further preferable that the writing unit is further configured to apply the re-write voltage pulse between the first and second electrodes so as to satisfy Vw1=Vw2.

It is still further preferable that the metal oxide is a tantalum oxide represented by a chemical formula of $TaO_x$ where $0.8 \leq x \leq 1.9$.

Thereby, it is possible to provide the variable resistance element that can be manufactured at low temperature, and to provide the variable resistance memory device including the variable resistance element to allow the variable resistance element to perform stable and high-speed operations. As a result, the secondary object of the present invention is achieved.

It is still further preferable that the variable resistance memory device further includes a current steering element electrically connected between the voltage pulse application device and one of the first and second electrodes.

Thereby, if the variable resistance memory device includes a plurality of the variable resistance elements serving as memory cells, it is possible to perform writing or erasing only for a memory cell selected from among the memory cells.

It is still further preferable that the current steering element is a transistor.

It is still further preferable that the current steering element is a diode.

Effects of the Invention

The method of programming a variable resistance element according to the present invention can change a resistance of a variable resistance film with stability and at a high speed, which enables the variable resistance element to perform stable and high-speed operations. In addition, the variable resistance memory device employing the method according to the present invention also enables the variable resistance film to change the resistance with stability and at a high speed.

NUMERICAL REFERENCES

Figure 1:
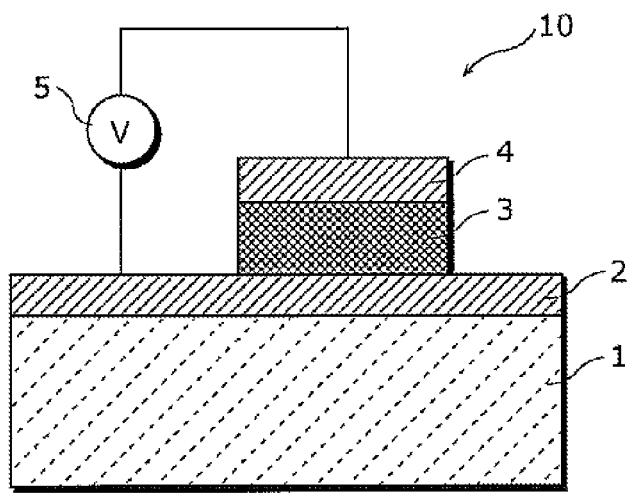
FIG. 1 is a schematic diagram showing an example of a structure of a variable resistance element according to a first embodiment of the present invention.

1 substrate
2 lower electrode
3 variable resistance layer
4 upper electrode
5 power source
10 variable resistance element
11 first terminal
12 second terminal
100 (1D1R) variable resistance memory device
101 memory array
102 address buffer
103 control unit
104 row decoder
105 word line driver
106 column decoder
107 bit line driver
W1, W2, W3 word line
B1, B2, B3 bit line
MC11, MC12, MC13, MC21, MC22, MC23, MC31, MC32, MC33 memory cell
D11, D12, D13, D21, D22, D23, D31, D32, D33 current steering element (bidirectional diode)
200 (1T1R) variable resistance memory device
201 memory array
202 address buffer
203 control unit
204 row decoder
205 word line driver
206 column decoder
207 bit line/plate line driver
P1, P2 plate line
MC211, MC212, MC221, MC222 memory cell
T211, T212, T221, T222 selection transistor

BEST MODE FOR CARRYING OUT THE INVENTION

The following describes preferred embodiments according to the present invention with reference to the drawings.

First Embodiment

[Structure]

FIG. 1 is a schematic diagram showing an example of a structure of a variable resistance element according to a first embodiment of the present invention. FIG. 1 shows not only a variable resistance element 10 but also a power source 5 that applies various voltage pulses to the variable resistance element 10. As shown in FIG. 1, the variable resistance element 10 according to the first embodiment includes: a substrate 1; a lower electrode 2 (first electrode) formed on the substrate 1; a variable resistance layer 3 formed on the lower electrode 2; and an upper electrode 4 (second electrode) formed on the variable resistance layer 3. Each of the lower electrode 2 and the upper electrode 4 is electrically connected to the variable resistance layer 3. Here, it is also possible that the upper electrode 4 is the first electrode and the lower electrode 2 is the second electrode.

The substrate 1 is a silicon substrate, for example.

Each of the lower electrode 2 and the upper electrode 4 can be made using, for example, one or more materials selected from a group including gold (Au), platinum (Pt), iridium (Ir), and copper (Cu).

The variable resistance layer 3 comprises a metal oxide having a resistance value increased or decreased depending on a polarity of an applied electric pulse. In this example, the variable resistance layer 3 comprises a tantalum oxide represented by a chemical formula of $TaO_x$. Here, a value of x (ratio of O) is preferably between 0.8 and 1.9. A thickness of the variable resistance layer 3 is preferably 1 μm or less.

The above structure is enough to allow the variable resistance element to change its resistance value at a high speed by applying voltage pulses with different polarities.

It is more preferable that the thickness of the variable resistance layer 3 is 200 nm or less. The structure facilitates manufacture of the variable resistance element using photolithography as a patterning process, thereby reducing a voltage value of a voltage pulse varying a resistance value of the variable resistance element.

Moreover, the thickness of the variable resistance layer 3 is preferably at least 5 nm or more. The structure can more surely prevent a breakdown (insulation breakdown) in application of a voltage pulse.

In order to reduce a voltage value of a voltage pulse varying a resistance value of the variable resistance element, the thinner variable resistance layer 3 is more preferable.

[Manufacturing Method]

First, the lower electrode 2 (having a thickness of 0.2 μm, for example) is formed on the substrate 1 by a sputtering method or the like. Then, a Ta target is prepared, and oxygen gas is mixed to argon gas according to a predetermined ratio of flow rates so as to perform reactive sputtering for the Ta target. Thereby, the variable resistance layer 3 comprising a tantalum oxide represented by a chemical formula of $TaO_x$ is formed on the lower electrode 2. Furthermore, the upper electrode 4 (having a thickness of 0.2 μm, for example) is formed on the variable resistance layer 3 by a sputtering method or the like. As a result, the variable resistance element 10 is manufactured.

Here, a size and a shape of each of the lower electrode 2, the upper electrode 4, and the variable resistance layer 3 can be adjusted by a mask and a photolithography process.

A value of x in the chemical formula $TaO_x$ for the variable resistance layer 3 can be easily adjusted by changing the ratio of the flow rate of the oxygen gas to the flow rate of the argon gas. The temperature of the substrate can be set as an ambient temperature, and heating is not necessary. Therefore, in comparison to the conventional crystallization of an oxide crystal having a perovskite structure, the variable resistance element according to the first embodiment can be manufactured at lower temperature and therefore does not have the conventional problem of deterioration of other materials resulting from high-temperature manufacturing.

[Operation]

As shown in FIG. 1, when the variable resistance element 10 is used, the lower electrode 2 and the upper electrode 4 are electrically connected to respective different terminals of the power source 5 (voltage pulse application device). The power source 5 drives the variable resistance element 10. The power source 5 can apply electric pulses (voltage pulses) having predetermined polarities, voltages, and time widths between the lower electrode 2 and the upper electrode 4. It is assumed in the following description that a voltage of a voltage pulse applied between the electrodes is determined by a potential of the upper electrode 4 with reference to the lower electrode 2.

Figure 2:
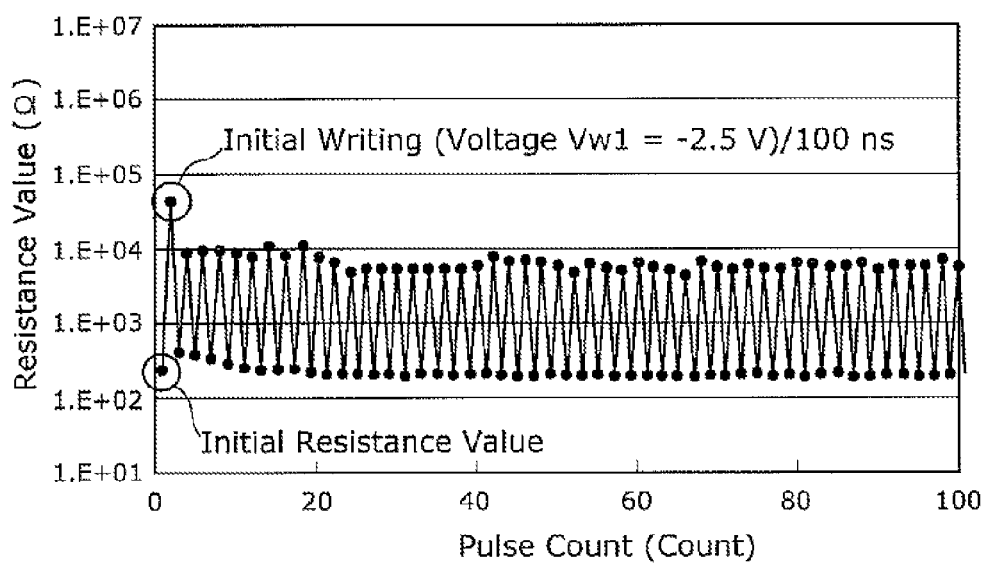
FIG. 2 is a graph plotting an example of variation of a resistance value of a variable resistance layer in the case where a voltage pulse is applied to a variable resistance element according to the first embodiment of the present invention.

FIG. 2 shows a variation of a resistance value of the variable resistance layer 3 according to the first embodiment of the present invention in the case where a voltage pulse is applied to the variable resistance layer 3. When the power source 5 applies a predetermined voltage pulse (initial write voltage pulse with a voltage value Vw1 of −2.5 V and a pulse width of 100 nsec) having a first polarity (negative polarity in this example) to the variable resistance layer 3, a resistance value (electric resistance) of the variable resistance layer 3 is increased from its initial resistance value to a high resistance state. After that, an erasing voltage pulse (with a voltage value Ve of +1.5 V and a pulse width of 100 nsec) having a second polarity (positive polarity in this example) different from the first polarity is applied to the variable resistance layer 3 so as to change the high resistance state to a low resistance state. Then, a predetermined voltage pulse (write voltage pulse with a voltage value Vw of −1.8 V and a pulse width of 100 nsec) having the first polarity (negative polarity in this example) is applied to the variable resistance layer 3 so as to change the low resistance state to a high resistance state. It is assumed in the following description that the variable resistance element 10 is in a high resistance state when a resistance value of the variable resistance layer 3 is a predetermined high value, and that the variable resistance element 10 is in a low resistance state when the resistance value of the variable resistance layer 3 is a predetermined low value lower than the predetermined high value.

It should be noted, as shown in FIG. 2, that the initial resistance value, namely a resistance value of the variable resistance layer 3 in the variable resistance element 10 that is manufactured but has not yet been written with any data, is equal to or less than a resistance value in the low resistance state after writing. In other words, once data is written, a resistance value of the variable resistance layer 3 in the low resistance state is equal to or higher than the initial resistance value.

In the first embodiment, a relationship between (a) a voltage value Vw1 of the initial write voltage pulse and (b) a voltage value Vw of a write voltage pulse applied after the initial write voltage pulse (hereinafter, referred to as "subsequent write voltage pulse(s)") to change the low resistance state to a high resistance state is |Vw1|>|Vw|. Here, the initial write voltage pulse is a write voltage pulse applied in the first writing step after manufacturing of the variable resistance element 10. The subsequent write voltage pulse is a write voltage pulse applied in writing steps after the first writing step after manufacturing the variable resistance element 10. Here, in the description and claims, when a voltage value relationship between voltage pulses is examined, an absolute value of the voltage value is compared between the voltage pulses, and a pulse width is not compared between the voltage pulses. When the above-mentioned relationship is satisfied, high-speed variation of the resistance value of the variable resistance layer 3 can be achieved with stability. When the variable resistance element 10 in a low resistance state receives a write voltage pulse (with a voltage value Vw) (hereinafter, the write voltage pulse is referred to also as a "first voltage pulse") having the first polarity (negative polarity in this example), the variable resistance element 10 is changed to a high resistance state. If the variable resistance element 10 is in a high resistance state and receives a voltage pulse having the same polarity as the first polarity (negative polarity in this example), the variable resistance element 10 is still in the high resistance state and not changed.

On the other hand, when the variable resistance element 10 in a high resistance state receives an erasing voltage pulse (with a voltage value Ve) (hereinafter, the erasing voltage pulse is referred to also as a "second voltage pulse") having the second polarity (positive polarity in this example) different from the polarity of the first voltage pulse, the variable resistance element 10 is changed to a low resistance state. If the variable resistance element 10 is in a low resistance state and receives a voltage pulse having the same polarity (positive polarity in this example) as the polarity of the second voltage pulse, the variable resistance element 10 is still in the low resistance state and not changed. Here, the variable resistance element 10 in the first embodiment is a nonvolatile memory element having resistance that varies depending on bipolar driving.

In the first embodiment, a high resistance state corresponds to "1" and a low resistance state corresponds to "0". The initial state of the variable resistance element 10 is assumed in a low resistance state ("0").

Figure 3:
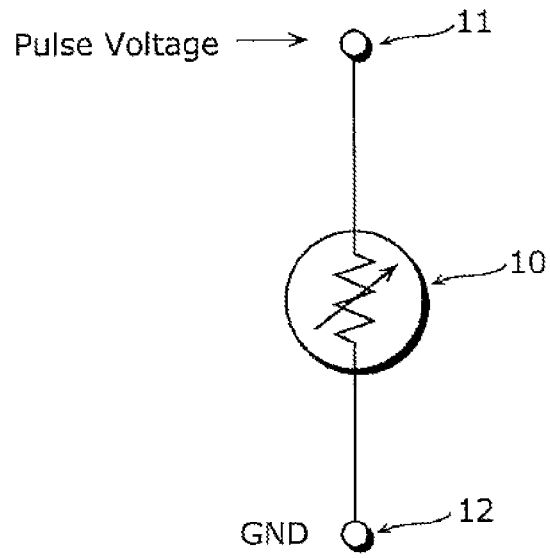
FIG. 3 is a diagram showing a circuit structure of the variable resistance element and an operation for writing data into a variable resistance element, according to the first embodiment of the present invention.

FIG. 3 is a diagram showing an example of a circuit operating the variable resistance element 10 according to the first embodiment of the present invention and an operation for writing data into the variable resistance element 10. Here, the variable resistance element 10 is used as a memory to and from which one bit data is processed (written and read). The circuit shown in FIG. 3 includes the variable resistance element 10, a first terminal 11, and a second terminal 12. The upper electrode 4 of the variable resistance element 10 is electrically connected to the first terminal 11, and the lower electrode 2 of the variable resistance element 10 is electrically connected to the second terminal 12.

Figure 4:
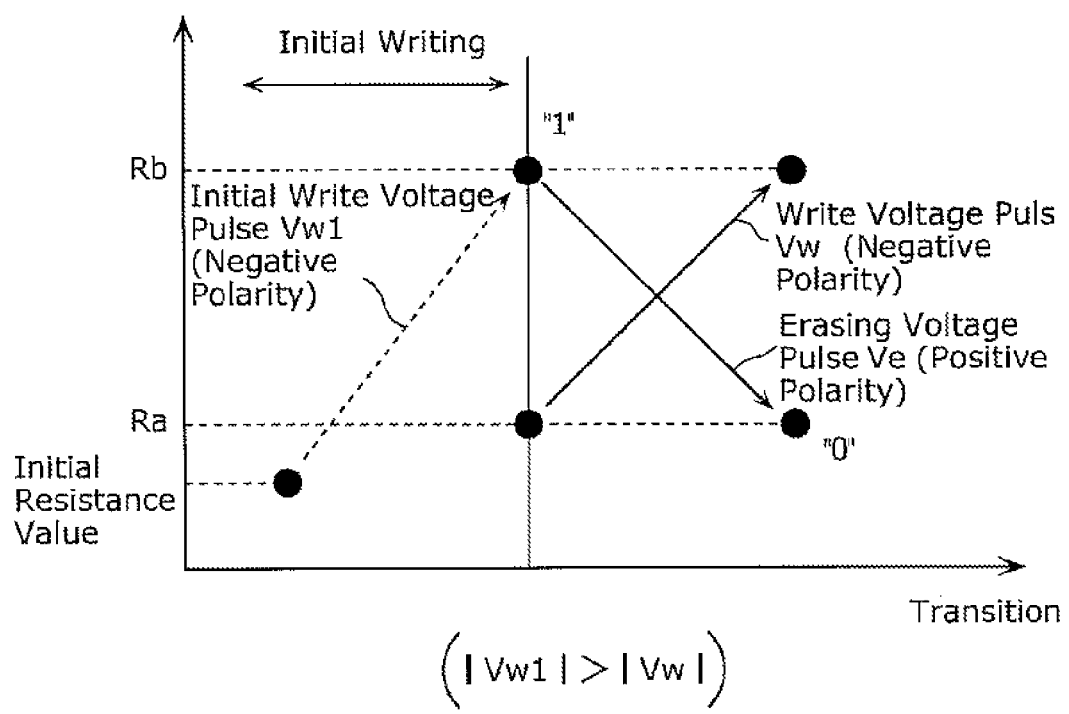
FIG. 4 is a graph plotting variation of a resistance value of the variable resistance layer in the case where data is written to and erased from the variable resistance element according to the first embodiment of the present invention.

FIG. 4 is a graph plotting variation of a resistance value of the variable resistance layer in the case where data is written to and erased from the variable resistance element according to the first embodiment of the present invention. As shown in FIG. 3, in writing data, the second terminal 12 is grounded (GND) and the first terminal 11 receives a voltage pulse. The voltage pulse is determined with reference to the lower electrode 2 and a ground point.

When an initial write voltage pulse (with a voltage value Vw1 and a negative polarity in this example) is applied to the first terminal 11 of the variable resistance element 10 in the initial state, a resistance value of the variable resistance element 10 is increased from a low resistance state Ra to a high resistance value Rb as shown in FIG. 4. On the other hand, when an erasing voltage pulse (with a voltage value Ve and a positive polarity in this example) is applied to the first terminal 11, the resistance value of the variable resistance element 10 is decreased from the high resistance state Rb to the low resistance value Ra. Furthermore, when a write voltage pulse (with a voltage value Vw and a negative polarity in this example) is applied to the first terminal 11, the resistance value of the variable resistance element 10 is increased from the low resistance state Ra to the high resistance value Rb.

In the first embodiment of the present invention, a relationship between the voltage value Vw1 of the initial write voltage pulse and the voltage value Vw of the write voltage pulse is set to be |Vw1|>|Vw|. If the relationship is satisfied, high-speed variation of the resistance value of the variable resistance layer 3 can be achieved with great stability.

When one bit data indicating "1" is programmed (written) to the variable resistance element 10, the variable resistance element 10 is changed to a high resistance state (or remains in the same high resistance state and not changed). The above operation is referred to as a "writing step for change to a high resistance state". In the writing step for change to a high resistance state, in FIG. 3, the second terminal 12 is grounded and the first terminal 11 receives the first voltage pulse (negative pulse in this example) for writing data. In the operation, a negative voltage pulse is applied to the variable resistance element 10 to set its resistance value to the high resistance state Rb. More specifically, if the resistance value prior to the application of the negative voltage pulse is in the low resistance state Ra, the application changes the low resistance state Ra to the high resistance state Rb. If the resistance value prior to the application of the negative voltage pulse is in the high resistance state Rb, the application does not change the high resistance state Rb. By the above-described method, the writing step for change to a high resistance state of the variable resistance element 10 is performed.

When one bit data indicating "0" is programmed to (erased from) the variable resistance element 10, the variable resistance element 10 is changed to a low resistance state (or remains in the same low resistance state and not changed). The operation is referred to as an "erasing step for change to a low resistance state". In the erasing step for change to a low resistance state, in FIG. 3, the second terminal 12 is grounded and the first terminal 11 receives the second voltage pulse (positive pulse in this example) for erasing data. In the operation, a positive voltage pulse is applied to the variable resistance element 10 to change its resistance value to the low resistance state Ra. More specifically, if the resistance value prior to the application of the positive voltage pulse is in the low resistance state Ra, the application does not change the low resistance state Ra. If the resistance value prior to the application of the positive voltage pulse is in the high resistance state Rb, the application changes the high resistance state Rb to the low resistance state Ra. By the above-described method, the erasing step for change to a low resistance state of the variable resistance element 10 is performed.

Figure 5:
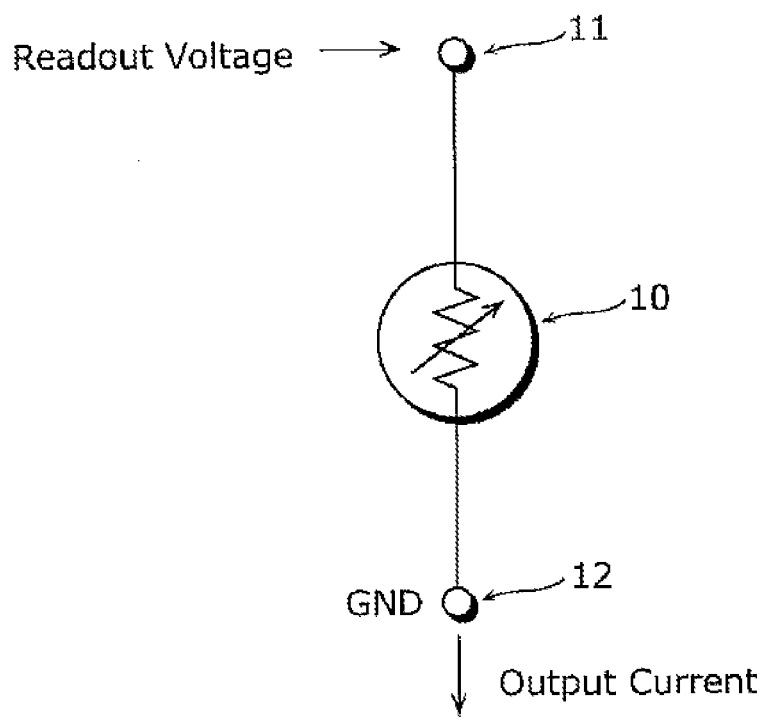
FIG. 5 is a diagram showing an operation in the case where data is read out from the variable resistance element according to the first embodiment of the present invention.
Figure 6:
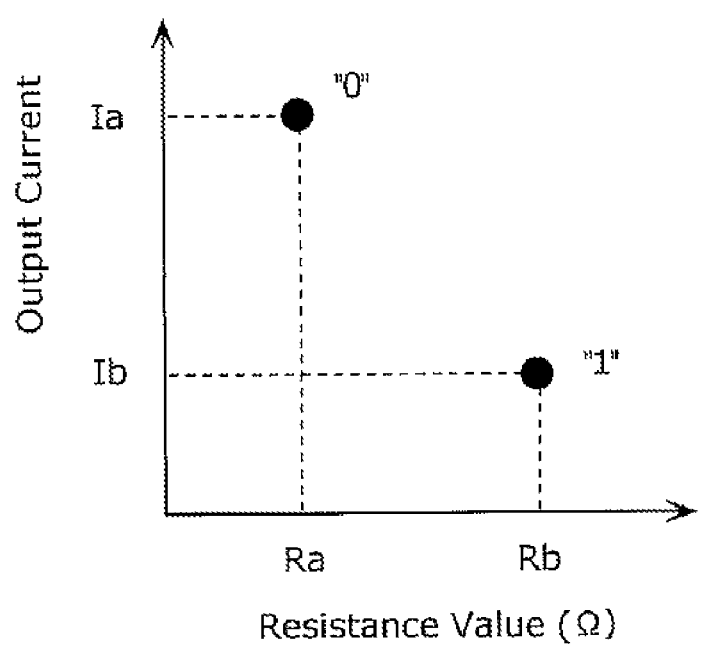
FIG. 6 is a graph plotting a relationship between (a) current flowing in the circuit and (b) a resistance value of the variable resistance element, when data is read out, according to the first embodiment of the present invention.

FIG. 5 is a diagram showing an operation in the case where data is read out from the variable resistance element according to the first embodiment of the present invention. FIG. 6 is a graph plotting a relationship between (a) current flowing in the circuit and (b) a resistance value of the variable resistance element, when data is read out, according to the first embodiment of the present invention. As shown in FIG. 5, in writing data, the second terminal 12 is grounded (GND) and the first terminal 11 receives a readout voltage. The readout voltage is determined with reference to the lower electrode 2 and a ground point.

When the readout voltage is applied to the first terminal 11, current depending on a resistance value of the variable resistance element 10 flows in the circuit (the variable resistance element 10). More specifically, as shown in FIG. 6, the current has a current value Ia when a resistance value of the variable resistance element 10 is in the low resistance state Ra, while the current has a current value Ib when the resistance value is in the high resistance state Rb.

When the resistance state of the variable resistance element 10 is to be detected, in FIG. 5, the second terminal 12 is grounded and the first terminal 11 receives a read voltage. The readout voltage is set to have +0.5 V, for example. When the readout voltage is applied to the variable resistance element 10, the current flowing in the circuit has a current value corresponding to the resistance value of the variable resistance element. By detecting the current value of the current flowing between the first terminal 11 and the second terminal 12, the resistance value of the variable resistance element 10 can be determined. More specifically, if the detected current value is Ia, it is determined that the resistance value of the variable resistance element 10 is in the low resistance state Ra. As a result, it is learned that data written in the variable resistance element 10 is "0". On the other hand, if the detected current value is Ib, it is determined that the resistance value is in the high resistance state Rb. As a result, it is determined that data written in the variable resistance element 10 is "1". By the above method, data is read out from the variable resistance element 10.

The variable resistance element 10 according to the first embodiment is nonvolatile so that its resistance value is not changed even if the variable resistance element 10 is powered off.

Variation of First Embodiment

It should be noted that the voltage value Vw1 and the pulse width of the initial write voltage pulse, the voltage value Vw and the pulse width of the subsequent write voltage pulse, the voltage value Ve and the pulse width of the erasing voltage pulse, and the value of the readout voltage are not limited to the above-described values. They may be any values as far as a relationship between voltages satisfies |Vw1|>|Vw| and the values are suitable for variable resistance elements actually manufactured.

It is also possible that another layer is formed between the lower electrode 2 and the variable resistance layer 3 or between the variable resistance layer 3 and the upper electrode 4. The structure may be modified as far as the lower electrode 2 and the variable resistance layer 3 are electrically connected to each other and the variable resistance layer 3 and the upper electrode 4 are electrically connected to each other.

As described earlier, reactive sputtering using a Ta target material is performed, and in the reactive sputtering, a ratio of a flow rate of oxygen gas to a flow rate of argon gas is adjusted to change the value of x in the chemical formula of $TaO_x$. However, the method of adjusting components in the variable resistance layer is not limited to the above. For example, the value of x in the chemical formula of $TaO_x$ can be changed if reactive sputtering is performed using a target in which Ta and $Ta_2O_5$ are mixed by a predetermined ratio.

[Effects]

In the variable resistance element according to the first embodiment, the initial write voltage pulse (first write voltage pulse), which is used to increase a resistance value from the initial state, has a voltage higher than that of general subsequent write voltage pulses (write voltage pulses after the first write voltage pulse) to achieve stable and high-speed resistance variation. Implementation of the variable resistance element as a memory can produce very good endurance characteristics. Moreover, the variable resistance element according to the first embodiment can be manufactured at ambient temperature. Therefore, the variable resistance element has high compatibility with conventional semiconductor manufacturing processes (at temperature of 400° C. or less). As a result, the variable resistance element can be manufactured considerably easily.

First Example

On the silicon substrate, the lower electrode made of platinum (Pt) (with dimensions of 10 μm×10 μm) is formed by a sputtering method to have a thickness of 0.1 μm. Then, a Ta target is prepared, and oxygen gas is mixed to argon gas according to a predetermined ratio of flow rates so as to perform reactive sputtering for the Ta target. Thereby, the variable resistance layer 3 comprising a tantalum oxide represented by the chemical formula of $TaO_x$ is formed on the lower electrode 2. The variable resistance layer is manufactured at ambient temperature without heating the substrate, for example. Then, on the variable resistance layer, the upper electrode made of Pt is formed by a sputtering method to have a thickness of 0.1 μm. A mask and photolithography are used for etching the variable resistance layer and the upper electrode together. Thereby, the variable resistance element is manufactured. Each of the upper electrode and the variable resistance layer has dimensions of 0.5 μm×0.5 μm (area of 0.25 μm²). A portion where the lower electrode and the variable resistance layer contact each other also has dimensions of 0.5 μm×0.5 μm (area of 0.25 μm²). A thickness of the variable resistance layer is 50 nm.

In a first example of the first embodiment, a ratio of a flow rate of oxygen gas to a flow rate of argon gas is adjusted in the reactive sputtering so that a value of x in $TaO_x$ included in the variable resistance layer is 1.2.

The value of x is analyzed by Rutherford Back Scattering (RBS). The analysis shows that the value of x is 1.2.

The variable resistance element manufactured by the above method is connected to the power source. Then, variation of a resistance value of the variable resistance element after application of voltage pulses is measured. In the resistance measurement, a voltage of +0.5 V is applied. The voltage of such a degree does not change the resistance value of the variable resistance element. The resistance value of the variable resistance element is calculated based on the applied voltage (+0.5 V) and current flowing in the variable resistance element.

Figure 7:
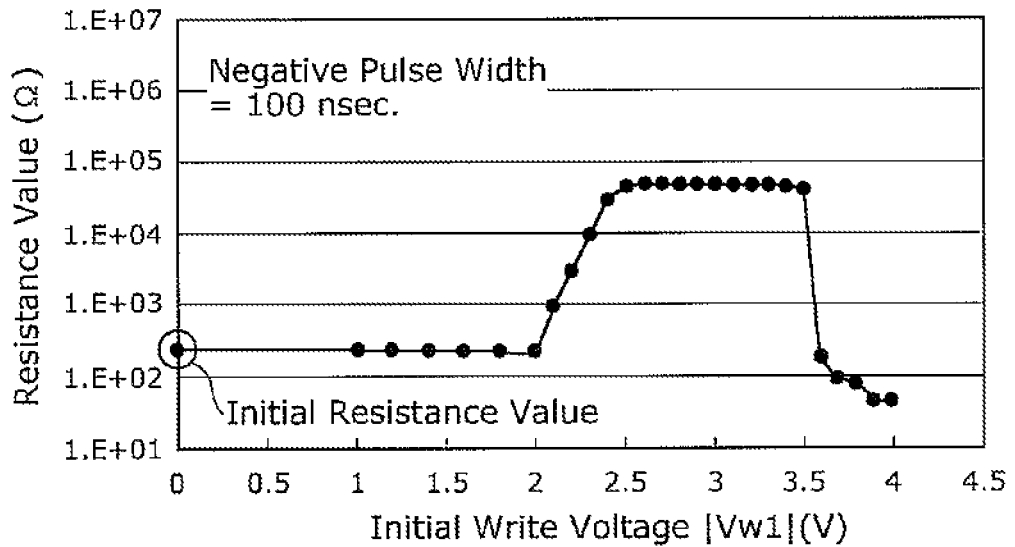
FIG. 7 is a graph plotting variation of a resistance value of the variable resistance element since an initial state in the case where a negative voltage pulse that is gradually increased is applied to the variable resistance element according to a first example of the first embodiment.

FIG. 7 shows a variation of a resistance value of the variable resistance element since an initial state in the case where an initial write voltage pulse (with a pulse width of 100 nsec and a negative polarity) is applied to the variable resistance element and a value of the initial write voltage pulse (an absolute value of a voltage value Vw1) is gradually increased, according to the first example of the first embodiment. During application of voltage pulses from −0.25 V to −3.5V, the resistance value is dramatically increased. After that, the resistance value is kept substantially constant. Then, after breakdown, the resistance value is dramatically decreased. From the above results, in the first example, the voltage value Vw1 of the initial write voltage pulse is set to be −2.5 V (with a pulse width of 100 nsec). FIG. 2 shows variation of the resistance value in the case where the voltage value Vw1 of the initial write voltage pulse is set to be −2.5 V (with a pulse width of 100 nsec), the voltage value Vw of the subsequent write voltage pulse is set to be −1.8 V (with a pulse width of 100 nsec), and the voltage value Ve of the erasing voltage pulse is set to be +1.5 V (with a pulse width of 100 nsec), and the subsequent write voltage pulse and the erasing voltage pulse are applied alternately. A voltage polarity is set to be positive when the potential of upper electrode is higher than that of the lower electrode. FIG. 2 shows that the first example can achieve highly-stable resistance variation. Moreover, the variable resistance element according to the first example shows good endurance characteristics (good performance in repetition of writing and erasing) ten thousand times or more. Furthermore, the variable resistance element according to the first example is nonvolatile so that its resistance value is not changed even if the variable resistance element is powered off.

First Comparative Example

Figure 8:
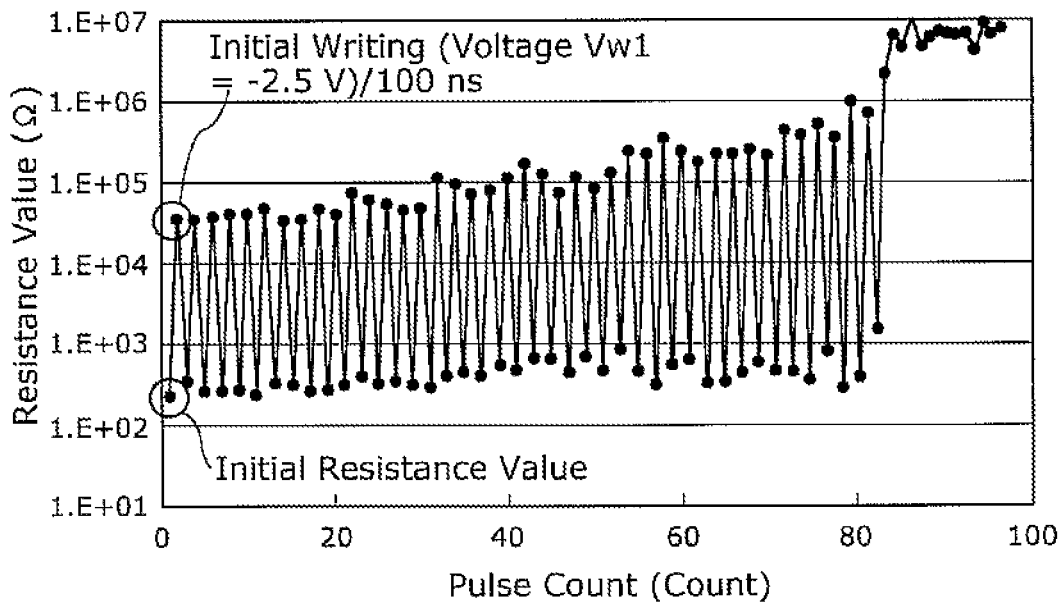
FIG. 8 is a graph plotting variation of a resistance value of the variable resistance layer in the case where the variable resistance element is programmed by a method according to a first comparative example (initial write voltage=−2.5 V, subsequent write voltage=−2.5 V, erasing voltage=+2.0 V).
Figure 9:
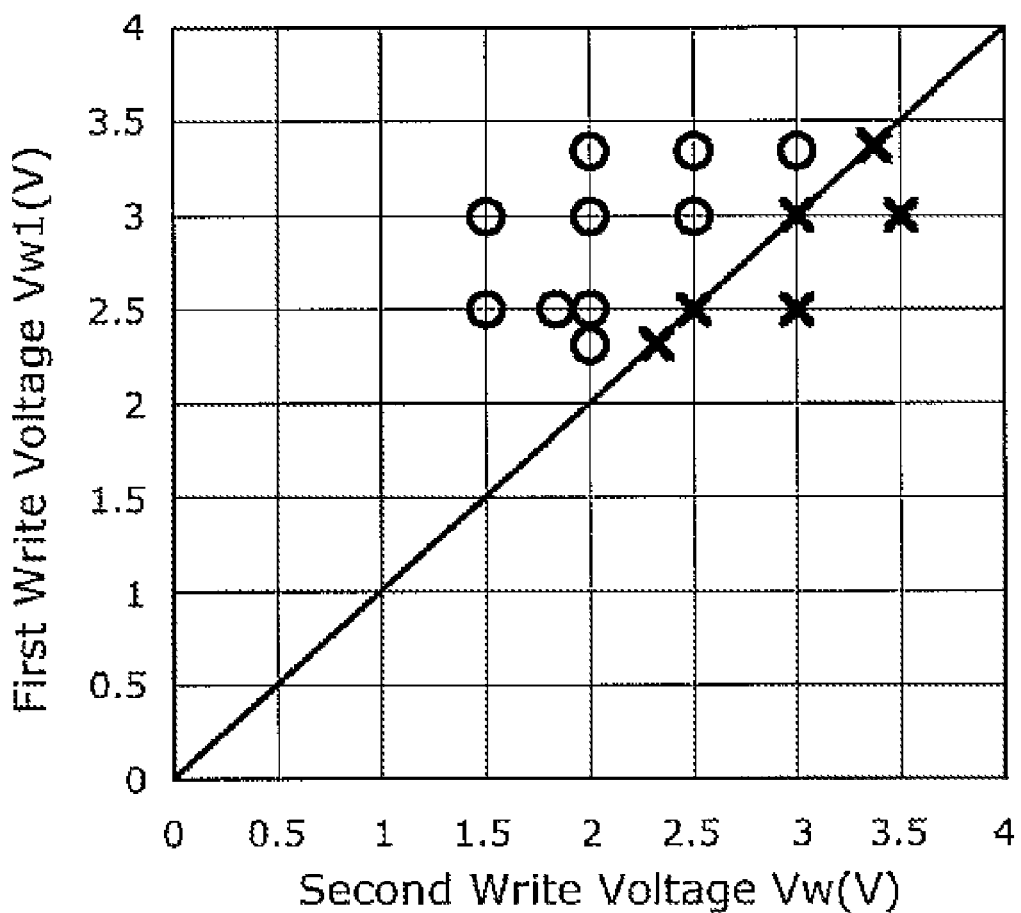
FIG. 9 is a graph plotting a result of endurance characteristics in the case where a strength relationship between an initial write voltage Vw1 and a write voltage Vw is changed to be applied to the variable resistance element according to the first example of the first embodiment.

FIG. 8 shows variation of a resistance value of the variable resistance element 10 according to the first example of the first embodiment in the case where the voltage value Vw1 of the initial write voltage pulse is set to be −2.5 V (with a pulse width of 100 nsec), the voltage value Vw of the subsequent write voltage pulses is set to be −2.5 V (with a pulse width of 100 nsec), and the voltage value Ve of the erasing voltage pulse is set to be +2.0 V (with a pulse width of 100 nsec), and the subsequent write voltage pulse and the erasing voltage pulse are applied alternately. When |Vw1|=|Vw| as described above, variation of the resistance is considerably unstable so that approximately 85 times of pulse application causes the resistance value to remain in a high resistance state and not to be changed to a low resistance state. FIG. 9 shows results of examining quality (good or not good) of endurance characteristics in varying (a) the voltage value Vw1 of the initial write voltage pulse and (b) the voltage value Vw of the subsequent write voltage pulses. Not good endurance characteristics in the results mean that stable resistance variation is not achieved from more than 100 times of pulse application.

The results show that it is quite important for stable resistance variation that a relationship between (a) the voltage value Vw1 of the initial write voltage pulse and (b) the voltage value Vw of the subsequent write voltage pulses is |Vw1|>|Vw|.

Figure 10:
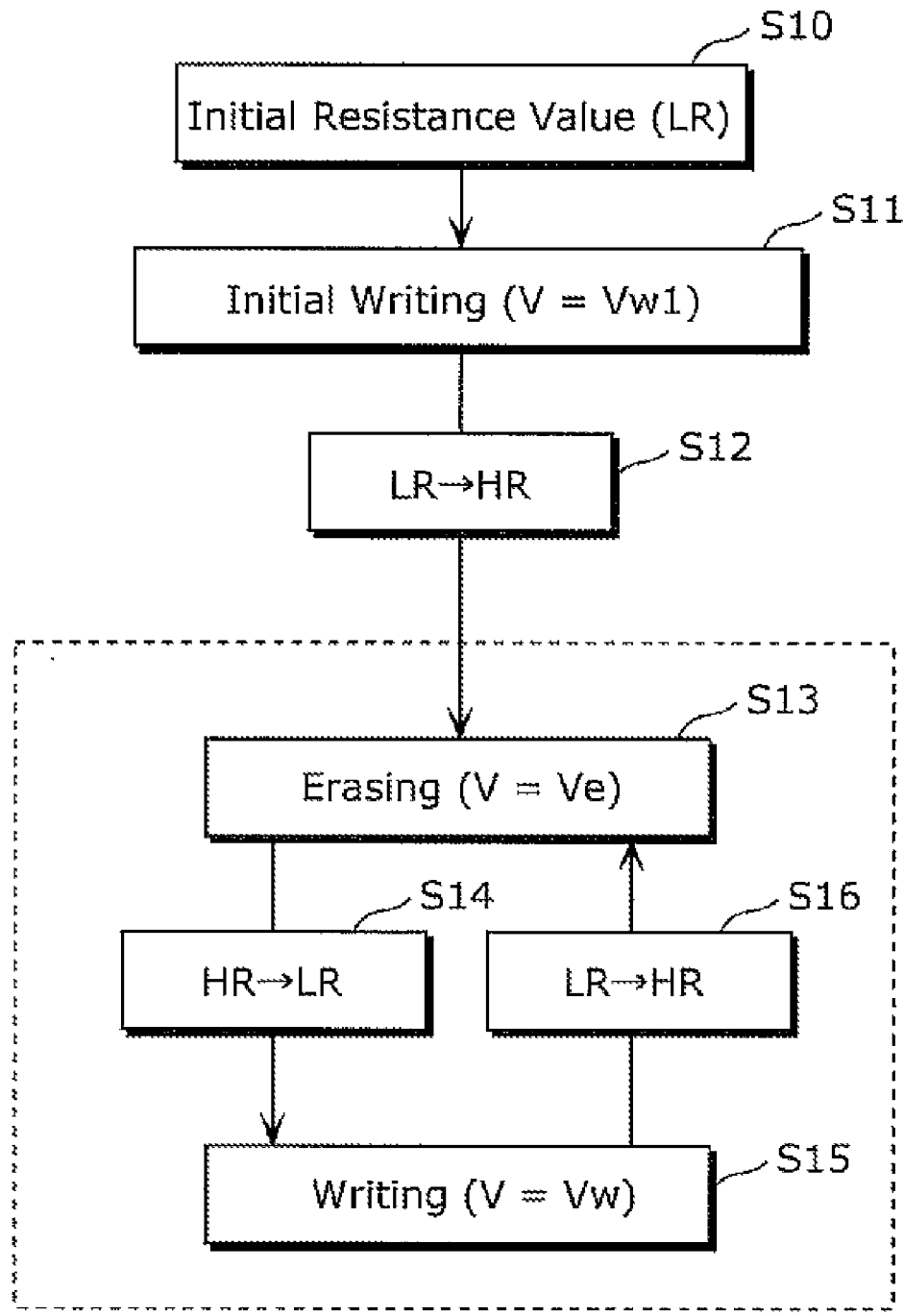
FIG. 10 is a flowchart of the method of programming the variable resistance element according to the first example of the first embodiment.

FIG. 10 is a flowchart of the method of programming the variable resistance element 10 according to the first example of the first embodiment.

This programming method is used to program the nonvolatile variable resistance element 10 that includes: the variable resistance layer 3 which comprises a metal oxide; and the lower electrode 2 and the upper electrode 4 which are connected to the variable resistance layer 3. The variable resistance element 10 changes between a high resistance state and a low resistance state, according to a polarity of applied electronic pulse. The programming method includes writing steps S11 and S15 and an erasing step S13. In each of the writing steps S11 and S15, a write voltage pulse having the first polarity is applied between the lower electrode 2 and the upper electrode 4 to cause the variable resistance layer 3 to change from a low resistance state to a high resistance state (S12, S16). In the erasing step S13, an erasing voltage pulse having the second polarity different from the first polarity is applied between the lower electrode 2 and the upper electrode 4 to change the variable resistance layer 3 from the high resistance state to a low resistance state (S14).

Regarding the writing steps S11 and S15, a write voltage pulse is applied between the lower electrode 2 and the upper electrode 4 to satisfy a relationship |Vw1|>|Vw|, where Vw1 represents a voltage value of a write voltage pulse in the first writing step S11 after manufacturing of the variable resistance element 10, and Vw represents a voltage value of a write voltage pulse in writing steps after the first writing step S15 after manufacturing the variable resistance element 10.

In other words, the first writing step S11 causes a resistance value of the variable resistance layer 3 to change from an initial resistance value (S10) to a resistance value (S12) that is higher than the initial resistance value. The writing steps S15 after the first writing step cause the resistance value of the variable resistance layer 3 to change from a low resistance value to a high resistance value (S16) that is higher than the low resistance value.

Then, in the erasing step S13, an erasing voltage pulse having a voltage value Ve is applied between the lower electrode 2 and the upper electrode 4 to satisfy a relationship |Vw|≧|Ve| between the voltage value Vw of the write voltage pulse and the voltage value Ve of the erasing voltage pulse. Thereby, the variable resistance layer 3 changes from a high resistance state to a low resistance state (S14).

As described above, in writing data to the variable resistance element, resistance variation with good endurance characteristics can be achieved when an absolute value |Vw1| of the voltage value Vw1 of the initial write voltage pulse which changes the initial state to a high resistance state is higher than an absolute value |Vw| of the voltage value Vw of the subsequent write voltage pulses.

Second Comparative Example

Figure 11:
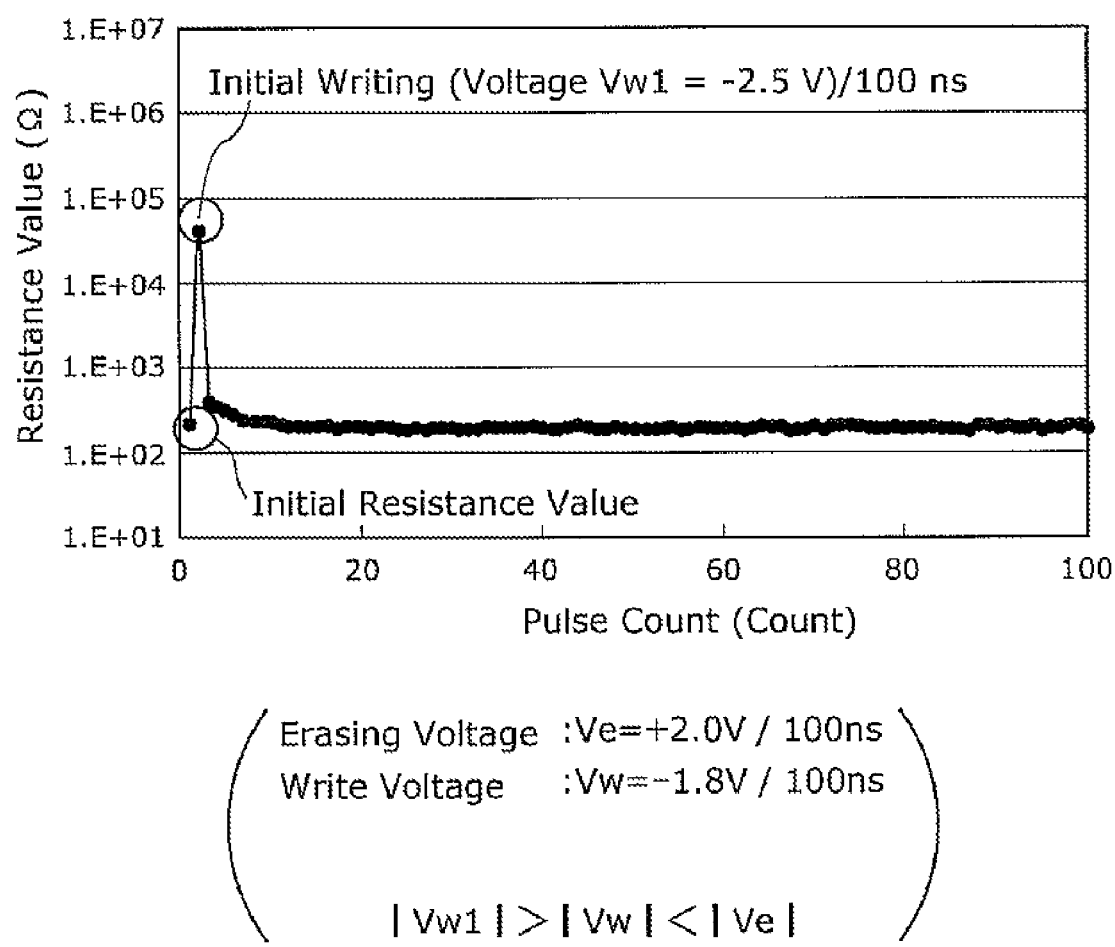
FIG. 11 is a graph plotting variation of a resistance value of the variable resistance layer in the case where the variable resistance element is programmed by a method according to a second comparative example (initial write voltage=−2.5 V, then write voltage=−1.8 V, erasing voltage=+2.0 V).
Figure 12:
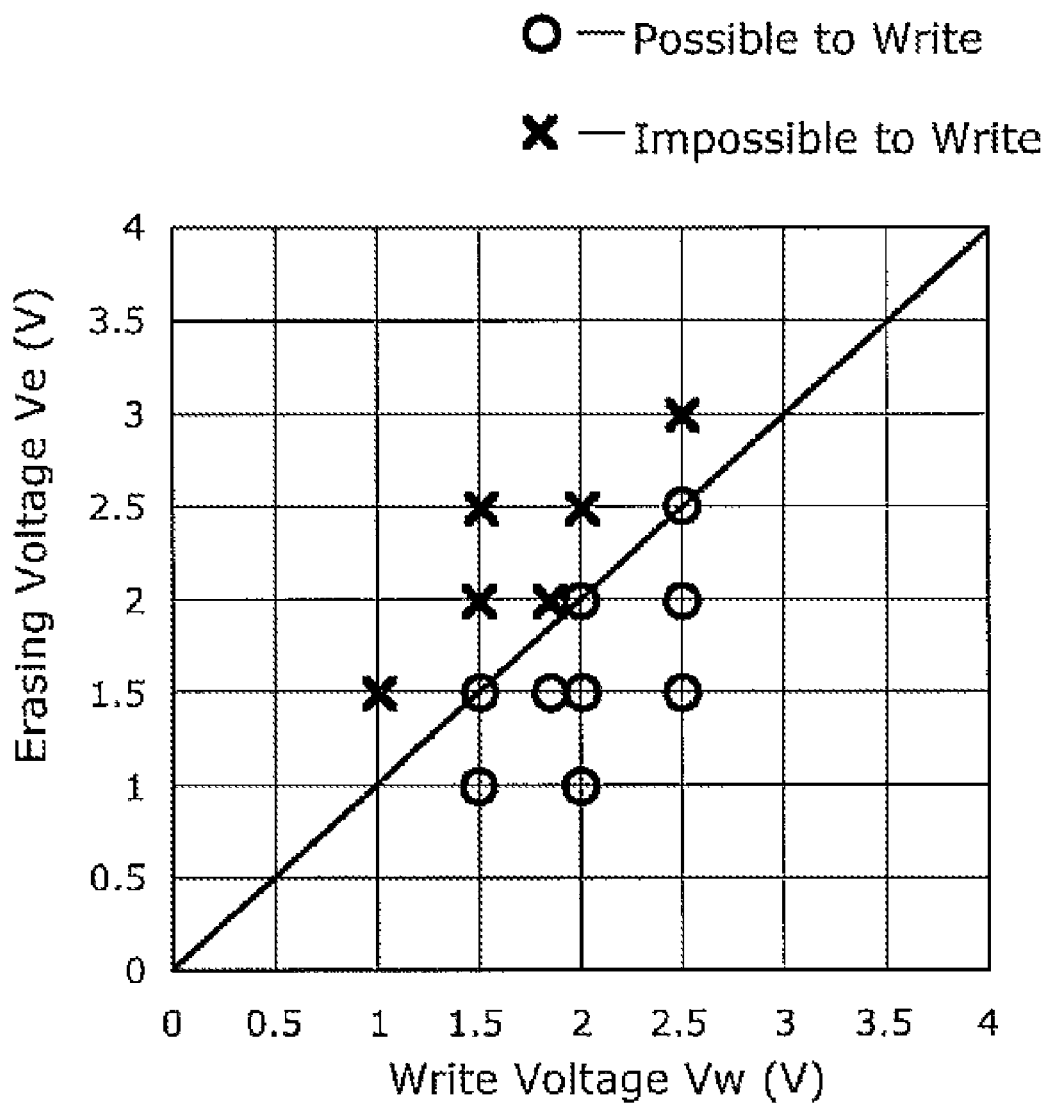
FIG. 12 is a graph plotting a result of writing in the case where a strength relationship between a write voltage Vw and an erasing voltage Ve is changed to be applied to the variable resistance element according to the first example of the first embodiment.

FIG. 11 shows variation of a resistance value of the variable resistance element 10 according to the first example of the first embodiment in the case where the voltage value Vw1 of the initial write voltage pulse is set to be −2.5 V (with a pulse width of 100 nsec), the voltage value Vw of the subsequent write voltage pulse is set to be −1.8 V (with a pulse width of 100 nsec), and the voltage value Ve of the erasing voltage pulse is set to be +2.0 V (with a pulse width of 100 nsec), and the subsequent write voltage pulse and the erasing voltage pulse are applied alternately. As shown in FIG. 11, the situation, of |Vw|<|Ve| totally fails writing to change a low resistance state to a high resistance state. FIG. 12 shows results of writing (change from a low resistance state to a high resistance state) in varying (a) the voltage value Vw of the write voltage pulse and (b) the voltage value Ve of the erasing voltage pulse. The situation impossible to write means no change from a low resistance state to a high resistance state. The results of FIG. 12 show that writing needs to satisfy a relationship |Vw|≧|Ve| between (a) the voltage value Vw of the write voltage pulse and (b) the voltage value Ve of the erasing voltage pulse.

Second Example

Most of variable resistance elements used in the first example show resistance variation with good endurance characteristics. However, there are exceptionally rare variable resistance elements that fail writing to change a low resistance state to a high resistance state. In order to solve the drawbacks, the second example includes a determination step for examining a resistance state of the variable resistance element 10 after writing, in addition to the processing in the first example. If writing fails, a re-write voltage pulse (with a voltage value Vw2) satisfying a relationship |Vw2|>|Vw| is applied to perform re-writing. Then, the general subsequent write voltage pulses (with the voltage value Vw) and the erasing voltage pulse (with the voltage value Ve) are applied.

Figure 13:
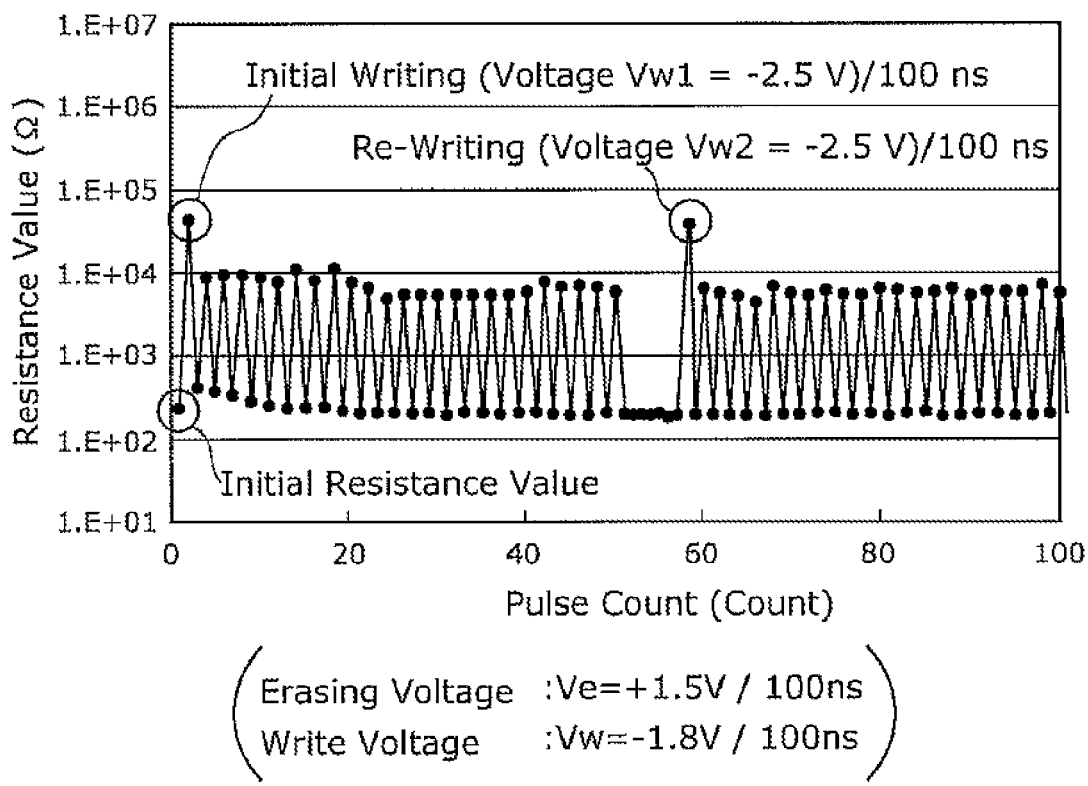
FIG. 13 is a graph plotting variation of a resistance value of the variable resistance layer in the case where the variable resistance element having a writing failure is programmed with a re-writing voltage same as an initial write voltage according to a second example of the first embodiment.

FIG. 13 shows a variation of a resistance value of the variable resistance layer in the case where the voltage value Vw1 of the initial write voltage pulse is set to be −2.5V (with a pulse width of 100 nsec), the voltage value Vw of the subsequent write voltage pulse is set to be −1.8 V (with a pulse width of 100 nsec), and the voltage value Ve of the erasing voltage pulse is set to be +1.5 V (with a pulse width of 100 nsec), and the subsequent write voltage pulse and the erasing voltage pulse are applied alternately. In FIG. 13, when a writing failure occurs, a voltage value Vw2 (set to be −2.5 V) of a re-write voltage pulse (with a pulse width of 100 nsec) is applied after the writing failure, and then the general subsequent write voltage pulse (with the voltage value Vw) and the erasing voltage pulse (with the voltage value Ve) are applied alternately. A voltage polarity is set to be positive when the potential of upper electrode is higher than that of the lower electrode. The results of FIG. 13 show that the second example can achieve considerably highly-stable resistance variation by performing re-writing using the re-write voltage pulse (with the voltage value Vw2) even if writing fails. Furthermore, likewise the first example, the variable resistance element according to the second example is nonvolatile so that its resistance value is not changed even if the variable resistance element is powered off.

Figure 14:
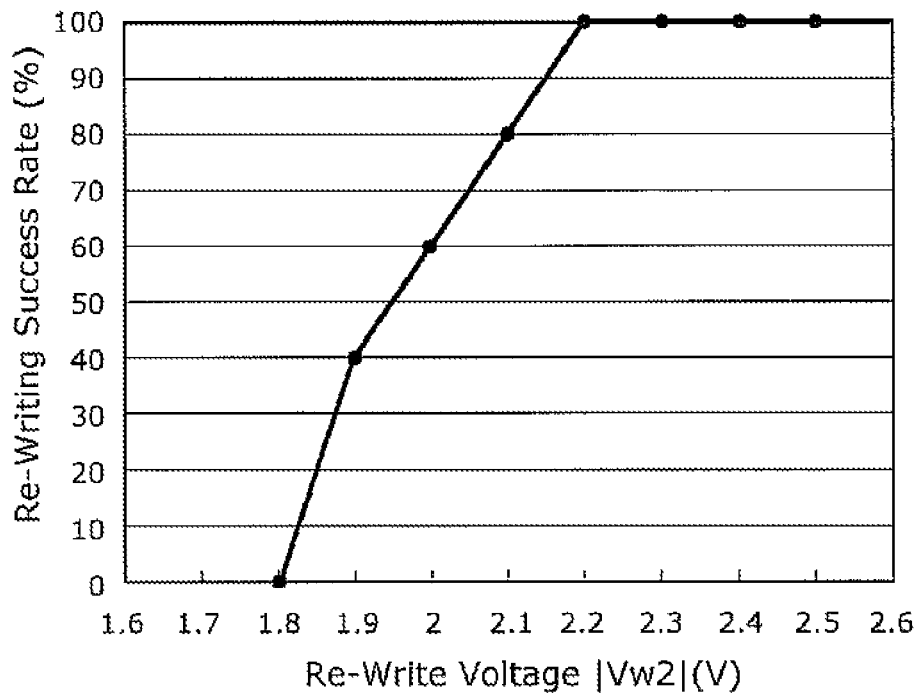
FIG. 14 is a graph plotting a relationship between a re-writing success rate and |Vw2|.

FIG. 14 shows a relationship between a re-writing success rate and |Vw2|, where the voltage value Vw of the write voltage pulse is set to be −1.8 V (with a pulse width of 100 nsec), the voltage value Ve of the erasing voltage pulse is set to be +1.5 V (with a pulse width of 100 nsec), and the voltage value Vw2 of the re-write voltage pulse (with a pulse width of 100 nsec) is set to be −1.8 V, −1.9 V, −2.0 V, −2.1 V, −2.2 V, −2.3 V, −2.4 V, or −2.5 V. The re-writing success rate refers to a value calculated by dividing (a) the number of changes from a low resistance state to a high resistance state caused by application of the re-write voltage pulse (with the voltage value Vw2) by (b) the number of applications of the re-write voltage pulse (with the voltage value Vw2) when writing to change a low resistance state to a high resistance state fails. For example, a re-writing success rate of 20% means that, after writing failure where application of a write voltage pulse fails to change a low resistance state, the re-write voltage pulse (with the voltage value Vw2) is applied five times and eventually a change of the low resistance state to a high resistance stage occurs once. The more |Vw2|, which is higher than |Vw|, approaches |Vw1|, the higher the re-writing success rate is. That is, the re-writing success rate is high when |Vw2| is substantially equal to |Vw1|.

Figure 15:
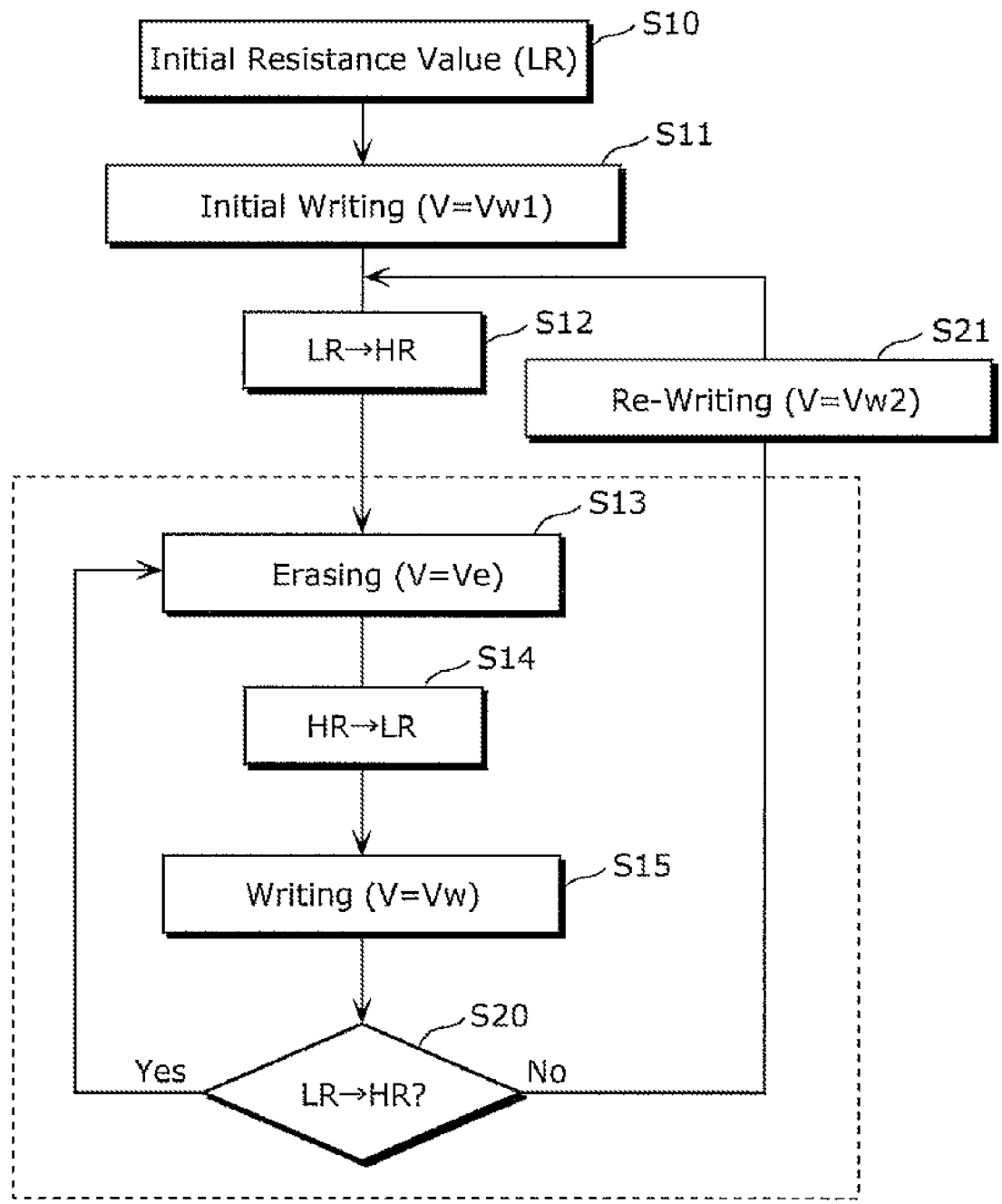
FIG. 15 is a flowchart of the method of programming the variable resistance element according to the second example of the first embodiment.

FIG. 15 is a flowchart of the method of programming the variable resistance element according to the second example of the first embodiment. The flowchart is equivalent to the flowchart of FIG. 10 added with a re-writing step at S20 and S21.

More specifically, writing steps in the programming method according to the second example include the re-writing step at S20 and S21 as well as the writing steps S11 and S15 of FIG. 10. In more detail, after completion of the writing step S15, a determination is made regarding the resistance state of the variable resistance layer 3 (S20). If the variable resistance layer 3 remains in a low resistance state even after the writing step S15 (No at S20), then a re-write voltage pulse having the voltage value Vw2 satisfying |Vw2|>|Vw| is applied between the lower electrode 2 and the upper electrode 4 (S21), thereby causing the variable resistance layer 3 to change from the low resistance state to a high resistance state (S12).

Here, the determination regarding the resistance state of the variable resistance layer 3 (S20) is the same as the readout step as described earlier (with reference to FIG. 5). If it is determined at S20 that the variable resistance layer 3 is in a high resistance state (Yes at S20), then it is considered that the writing step (S15) is successful, and then an erasing step is performed (S13).

As described above, the above-described programming method can achieve resistance variation with extremely high reliability and good endurance characteristics. By the programming method, in writing data to the variable resistance element, an absolute value |Vw1| of the voltage value Vw1 of the initial write voltage pulse which changes the initial state to a high resistance state is higher than an absolute value |Vw| of the voltage value Vw of the subsequent write voltage pulses, and after completion of any writing step (any of writing steps after an initial writing step, which is hereinafter referred to also as a "subsequent writing step"), a determination is made as to whether the resistance state is a low resistance state (LR) or a high resistance state (HR). If it is determined that the resistance value remains in a low resistance state after the writing step, a voltage pulse with the voltage value Vw2 that is higher than the absolute value |Vw| of the voltage value Vw of the write voltage pulse is applied to change the resistance value to a high resistance state.

Another Variation of First Embodiment

It should be noted that it has been described in the first embodiment of the present invention that the value of x in TaO$_x$ included in the variable resistance layer 3 is 1.2. However, the same effects as described in the first embodiment can be produced when the value of x is between 0.8 and 1.9. When the value of x is beyond the range between 0.8 and 1.9, the variable resistance element does not operate correctly as a memory element. When the value of x is, for example, 2.3, the variable resistance element has an initial resistance value higher than the initial resistance value described in the first embodiment. Application of the same voltage pulses as described in the first embodiment to this variable resistance element damages insulation and does not allow the variable resistance element to operate as a memory element. When the value of x is 0.4, the variable resistance element has an initial resistance value lower than the initial resistance value described in the first embodiment. Application of the write voltage pulses to this variable resistance element does not increase the resistance value.

It should also be noted that it has been described in the first embodiment of the present invention that the electrodes are made of platinum (Pt). However, the present invention is not limited to the above. The same effects as described in the first embodiment can be produced when at least one of the upper electrode 4 and the lower electrode 2 is made of platinum (Pt), gold (Au), iridium (Ir), or copper (Cu).

It should also be noted that it has been described in the first embodiment of the present invention that the metal oxide included in the variable resistance layer 3 is TaO$_x$. However, the metal oxide in the present invention is not limited to TaO$_x$. Examples of possible metal oxide in the variable resistance element 10 according to the present invention are HfO$_x$ ($0.9 \leq x \leq 1.6$) and ZrO$_x$ ($0.9 \leq x \leq 1.4$).

Second Embodiment

The second embodiment of the present invention is an application of the variable resistance element 10 described in the first embodiment. In the second embodiment, a variable resistance memory device 200 including the variable resistance element and a voltage pulse application device is described.

<Structure of Variable Resistance Memory Device 200>

Figure 16:
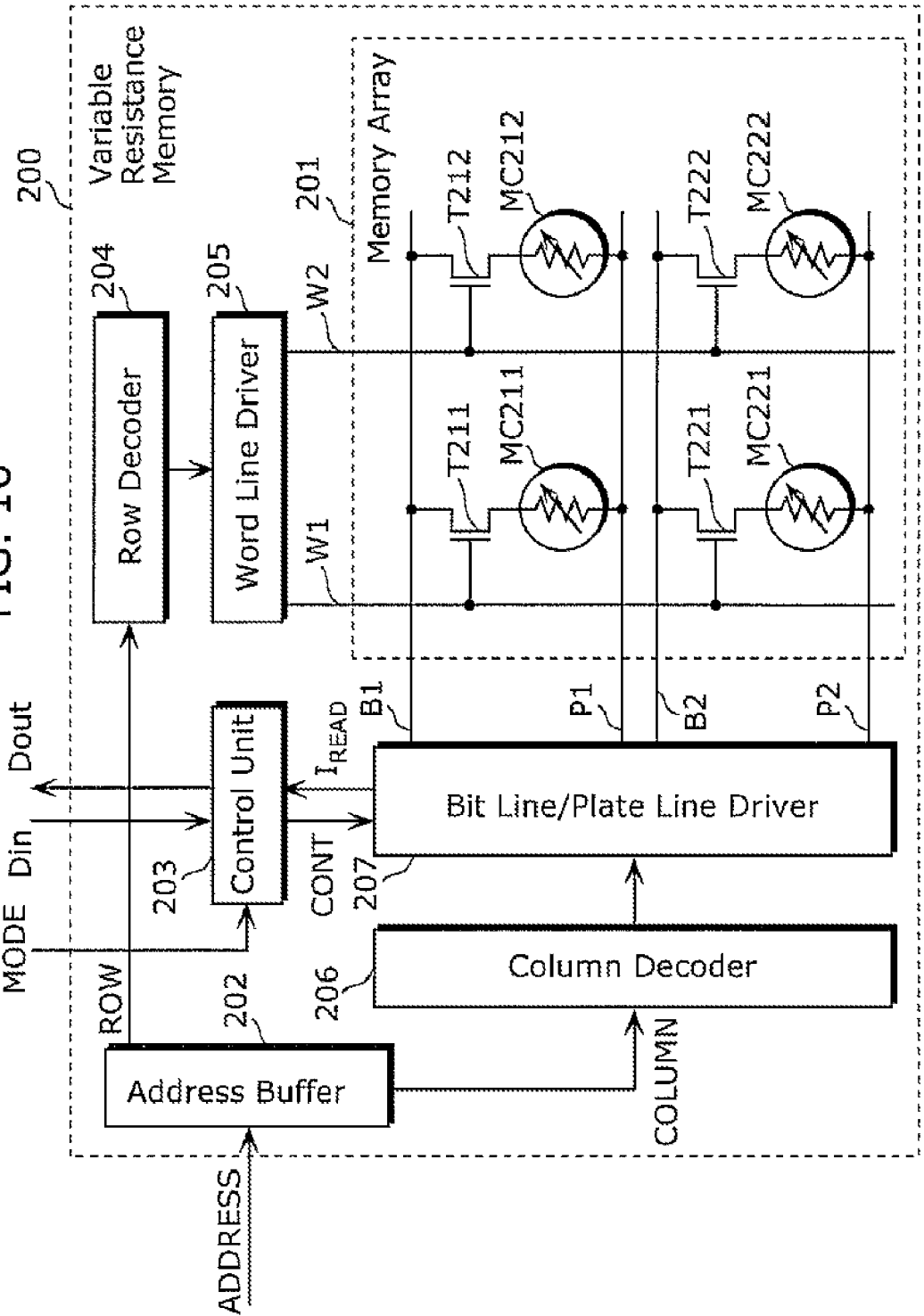
FIG. 16 is a block diagram illustrating an example of a structure of a (1T1R) variable resistance memory device according to the second embodiment of the present invention.

FIG. 16 is a block diagram illustrating an example of a structure of the variable resistance memory device 200 according to the second embodiment of the present invention.

The variable resistance memory device 200 includes a memory array 201, an address buffer 202, a control unit 203, a row decoder 204, a word line driver 205, a column decoder 206, and a bit line/plate line driver 207. Here, a circuit including the address buffer 202, the control unit 203, the row decoder 204, the word line driver 205, the column decoder 206, and the bit line/plate line driver 207 corresponds to the voltage pulse application device according to the second embodiment. The voltage pulse application device applies various voltage pulses to the variable resistance element 10.

As shown in FIG. 16, the memory array 201 includes: two word lines W1 and W2; two bit lines B1 and B2; two plate lines P1 and P2; four transistors (examples of current steering elements) T211, T212, T221, and T222; and four memory cells MC211, MC212, MC221, and MC222. The word lines W1 and W2 are arranged extending in a first direction. The bit lines B1 and B2 are arranged extending in a second direction and cross the word lines W1 and W2. The plate lines P1 and P2 are arranged extending in the second direction and correspond to the bit lines B1 and B2, respectively. The transistors T211, T212, T221, and T222 are arranged in a matrix and each of the transistors corresponds to a corresponding one of crosspoints of the word lines W1 and W2 and the bit lines B1 and B2. The memory cells MC211, MC212, MC221, and MC222 are arranged in a matrix and correspond to the transistors T211, T212, T221, and T222, respectively. The number of the above-described structure elements is not limited to the above. For instance, although the variable resistance memory device 200 in FIG. 16 includes the memory array 201 having the four memory cells MC211, MC212, MC221, and MC222, the memory array 201 may have five or more memory cells in a matrix array.

Here, each of the memory cells MC211, MC212, MC221, and MC222 corresponds to the variable resistance element 10 described in the first embodiment.

The transistor T211 and the memory cell MC211 are provided between the bit line B1 and the plate line P1. Here, a source of the transistor T211 serving as a current steering element and the first terminal 11 (shown in FIG. 3) of the memory cell MC211 are arranged in series to be connected to each other. The structure is explained in more detail below. The transistor T211 is arranged between the bit line B1 and the memory cell MC211 and connected to the bit line B1 and the memory cell MC211. The memory cell MC211 is arranged between the transistor T211 and the plate line P1 and connected to the transistor T211 and the plate line P1. A drain of the transistor T211 is connected to the bit line B1. The terminal 12 (shown in FIG. 3) of the memory cell MC211 is connected to the plate line P1. Furthermore, a gate of the transistor T211 is connected to the word line W1.

The other three transistors T212, T221, and T22 are arranged in series with the other three memory cells MC212, MC221, and MC222, respectively. The connection structure among the transistors and the memory cells is easily understand from the above description and the drawings. Therefore, the connection structure is not explained again.

With the above structure, when a predetermined voltage (activation voltage) is applied to gates of the transistors T211, T212, T221, and T222 via the word lines W1 and W2, conduction between a drain and a source of each of the transistors T211, T212, T221, and T22 is achieved.

The address buffer 202 receives address signals ADDRESS from an external circuit (not shown), and then, based on the received address signals ADDRESS, provides row address signals ROW to the row decoder 204 and column address signals COLUMN to the column decoder 206. The address signals ADDRESS indicate an address of a memory cell selected from the memory cells MC211, MC212, MC221, and MC222. The row address signals ROW indicate an address of a row of the address indicated in the address signals ADDRESS. The column address signals COLUMN indicate an address of a column of the address indicated in the address signals ADDRESS.

The control unit 203 selects at least one of a write mode, a reset mode, and a read mode, based on a mode selection signal MODE received from an external circuit.

In the write mode, the control unit 203 issues a control signal CONT instructing to "apply a write voltage", to the bit line/plate line driver 207, based on input data Din received from an external circuit. In the read mode, the control unit 203 issues a control signal CONT instructing to "apply a read voltage", to the bit line/plate line driver 207. The control unit 203 further receives, in the read mode, signals IREAD from the bit line/plate line driver 207, and provides the external circuit with output data Dout indicating a bit value corresponding to the signals IREAD. The signals IREAD indicate a current value of current flowing in the plate lines P1 and P2 in the read mode. In the reset mode, the control unit 203 detects a memory state of each of the memory cells MC211, MC212, MC221, and MC222, and based on the memory state, issues a control signal CONT instructing to "apply a reset voltage", to the bit line/plate line driver 207.

The row decoder 204 receives the row address signals ROW from the address buffer 202, and based on the row address signals ROW, selects one of the two word lines W1 and W2. Based on the output signal of the row decoder 204, the word line driver 205 applies an activation voltage to the word line selected by the row decoder 204.

The column decoder 206 receives the column address signals COLUMN from the address buffer 202, and based on the column address signals COLUMN, selects one of the two bit lines B1 and B2 and also selects one of the two plate lines P1 and P2.

When the bit line/plate line driver 207 receives the control signal CONT instructing to "apply a write voltage" from the control unit 203, the bit line/plate line driver 207 applies the write voltage VWRITE to the bit line selected by the column decoder 206 and sets the plate line selected by the column decoder 206 to be grounded, based on the output signal of the column decoder 206.

When the bit line/plate line driver 207 receives the control signal CONT instructing to "apply a read voltage" from the control unit 203, the bit line/plate line driver 207 applies the read voltage VREAD to the bit line selected by the column decoder 206 and sets the plate line selected by the column decoder 206 to be grounded, based on the output signal of the column decoder 206. Then, the bit line/plate line driver 207 provides the control unit 203 with the signals IREAD indicating the current value of current flowing in the selected plate line.

When the bit line/plate line driver 207 receives the control signal CONT instructing to "apply a reset voltage" from the control unit 203, the bit line/plate line driver 207 applies the reset voltage VRESET to the bit line selected by the column decoder 206 and sets the plate line selected by the column decoder 206 to be grounded, based on the output signal of the column decoder 206.

Here, the write voltage VWRITE is set, for example, to have a voltage value Vw1 of "−2.5 V" in the initial writing step and a voltage value Vw of "−1.8 V" in the subsequent writing steps. Here, a pulse width of the write voltage VWRITE is set to "100 nsec", for example. Furthermore, the re-write voltage VREAD is set, for example, to have a voltage value of "+0.5 V", for example. Moreover, the reset voltage VRESET (erasing voltage VERACE) is set to have a voltage value Ve of "+1.5 V" and a pulse width of "100 nsec". This means that a circuit that is a combination of the bit line/plate line driver 207 and the control unit 203 according to the second embodiment corresponds to each of the writing unit and the erasing unit included in the voltage pulse application device according to one of the aspects of the present invention.

<Operation of Variable Resistance Memory Device 200>

Next, an example of operations performed by the variable resistance memory device 200 shown in FIG. 16 is described.

The operations of the variable resistance memory device 200 includes: a write mode for writing input data Din to a memory cell; a reset mode for resetting the data written in the memory cell; and a read mode for outputting (reading) the data as output data Dout from the memory cell. The following describes operations in each of the modes one by one.

For convenience in the following explanation, it is assumed that the memory cells MC211, MC212, MC221, and MC222 are initialized to a high resistance state and that the address signals ADDRESS indicate an address of the memory cell MC211.

[Write Mode]

First, an example of operation performed by the variable resistance memory device 200 in the write mode is described.

The control unit 203 receives input data Din from an external circuit. Then, if the input data Din is "1", then the control unit 203 issues the control signal CONT instructing to "apply a write voltage" to the bit line/plate line driver 207. On the other hand, if the input data Din is "0", then the control unit 203 does not issues the control signal CONT.

Next, when the bit line/plate line driver 207 receives the control signal CONT instructing to "apply a write voltage" from the control unit 203, the bit line/plate line driver 207 applies the write voltage VWRITE to the bit line B1 selected by the column decoder 206. In addition, the bit line/plate line driver 207 sets the plate line P1 selected by the column decoder 206, to be grounded.

Here, the word line driver 205 applies an activation voltage to the word line W1 selected by the row decoder 204. Therefore, conduction between the drain and the source of the transistor T211 is achieved.

Thereby, in the initial writing step, a pulse voltage (negative pulse) is applied as the write voltage VWRITE to the memory cell MC211. Here, the pulse voltage (negative pulse) is set to have a voltage value of "−2.5 V" in the initial writing step and a voltage value of "−1.8 V" in the subsequent writing steps, and to have a pulse width of "100 nsec". Therefore, a resistance value of the memory cell MC211 is changed from a low resistance state to a high resistance state. On the other hand, no negative pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, the transistors T211 to T222 which are current steering elements can selectively change only the memory cell MC211 to a high resistance state. As a result, one bit data indicating "1" corresponding to the high resistance state is written into the memory cell MC211 (in other words, one bit data can be memorized in the memory cell MC211).

When the writing step for the memory cell MC211 is completed, new address signals ADDRESS are provided to the address buffer 202, and the above-described operation performed by the variable resistance memory device 200 in the write mode is repeated for the other memory cells except the memory cell MC211.

[Read Mode]

Next, an example of operation performed by the variable resistance memory device 200 in the read mode is described.

The control unit 203 issues a control signal CONT instructing to "apply a read voltage" to the bit line/plate line driver 207.

Next, when the bit line/plate line driver 207 receives the control signal CONT instructing to "apply a read voltage" from the control unit 203, the bit line/plate line driver 207 applies the read voltage VREAD to the bit line B1 selected by the column decoder 206. In addition, the bit line/plate line driver 207 sets the plate line P1 selected by the column decoder 206 to be grounded.

Here, the word line driver 205 applies an activation voltage to the word line W201 selected by the row decoder 204. Therefore, conduction between the drain and the source of the transistor T211 is achieved.

Thereby, a measuring voltage as the write voltage VREAD having a voltage value of "+0.5 V" is applied to the memory cell MC211. As a result, current having a current value depending on the resistance value of the memory cell MC211 flows into the plate line P1 via the memory cell MC211.

Here, no measured voltage is applied to the memory cells MC221 and MC222, and no activation voltage is applied to the gate of the transistor T212 connected in series with the memory MC212. Therefore, the above current does not flow in the memory cells MC212, MC221, and MC222.

Next, the bit line/plate line driver 207 measures a current value of current flowing in the plate line P1, and provides the control unit 203 with the signals TREAD indicating a value of the measurement.

Next, the control unit 203 provides the outside with output data Dout depending on a current value indicated by the signals IREAD. For example, if the current value indicated by the signals IREAD is a current value of current flowing at the time when the memory cell MC211 is in the high resistance state, then the control unit 203 outputs output data Dout indicating "1".

Thereby, current depending on the resistance value of the memory cell MC211 flows only to the memory cell MC211 and then to the plate line P1. As a result, one bit data can be read out from the memory cell MC211.

When the reading step for the memory cell MC211 is completed, new address signals ADDRESS are provided to the address buffer 202, and the above-described operation performed by the variable resistance memory device 200 in the read mode is repeated for the other memory cells except the memory cell MC211.

[Reset Mode]

Next, an example of operation performed by the variable resistance memory device 200 in the reset mode is described.

First, the control unit 203 executes the above-described read mode to obtain information of a state (write state) of a resistance value of the memory cell MC211.

Next, if it is determined that one bit data indicating "1" is written in the memory cell MC211 (in other words, if it is determined that the memory cell MC211 is in a high resistance state), then the control unit 203 issues the control signal CONT instructing to "apply a reset voltage" to the bit line/ plate line driver 207. On the other hand, if it is determined that one bit data indicating "0" is written in the memory cell MC211 (in other words, if it is determined that the memory cell MC211 is in a low resistance state), then the control unit 203 does not issues the above control signal CONT to the bit line/plate line driver 207.

Then, when the bit line/plate line driver 207 receives the control signal CONT instructing to "apply a reset voltage" from the control unit 203, the bit line/plate line driver 207 applies the reset voltage VRESET to the bit line B1 selected by the column decoder 206. In addition, the bit line/plate line driver 207 sets the plate line P1 selected by the column decoder 206, to be grounded.

Here, the word line driver 205 applies an activation voltage to the word line W1 selected by the row decoder 204. Therefore, conduction between the drain and the source of the transistor T211 is achieved.

Thereby, a pulse voltage (positive pulse) is applied as the reset voltage VRESET to the memory cell MC211. Here, the pulse voltage is set to have a voltage of "+1.5 V" and a pulse width of "100 nsec". Therefore, a resistance value of the memory cell MC211 is changed from a high resistance state to a low resistance state. On the other hand, no positive pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, only the memory cell MC211 in a high resistance state can be changed to a low resistance state. As a result, one bit data indicating "1" corresponding to the high resistance state memorized in the memory cell MC211 can be reset to indicate "0" corresponding to the low resistance state.

When the reset step for the memory cell MC211 is completed, new address signals ADDRESS are provided to the address buffer 202, and the above-described operation performed by the variable resistance memory device 200 in the reset mode is repeated for the other memory cells except the memory cell MC211.

It should be noted that the variable resistance memory device 200 according to the second embodiment of the present invention may have a function of "re-writing" data into the variable resistance element described in the first embodiment. More specifically, the voltage pulse application device according to the second embodiment may include a circuit (re-writing unit) to perform the "re-writing" step described in the first embodiment. Likewise the writing unit and the erasing unit, the re-writing circuit is implemented as a combination of the bit line/plate line driver 207 and the control unit 203.

[Effects]

As described above, the variable resistance memory device 200 can be implemented by including the memory array 201 in which the variable resistance elements 10 described in the first embodiment are embedded as the memory cells MC211, MC212, MC221, and MC222. Therefore, the variable resistance memory device 200 according to the second embodiment can perform highly-stable and high-speed operations. Even if the variable resistance memory device 200 according to the second embodiment is able to be used longer than conventional variable resistance memory device, the variable resistance memory device 200 has reliability to serve as an memory array.

Third Embodiment

The third embodiment of the present invention is another application of the variable resistance element 10 described in the first embodiment. In the third embodiment, a structure and operations of a variable resistance memory device 100 (crosspoint memory) are described. Here, the crosspoint memory is a memory device in which each of active layers is provided at each of crosspoints (three-dimensional crosspoints) of each word lines and each bit lines.

[Structure of Variable Resistance Memory Device 100>

Figure 17:
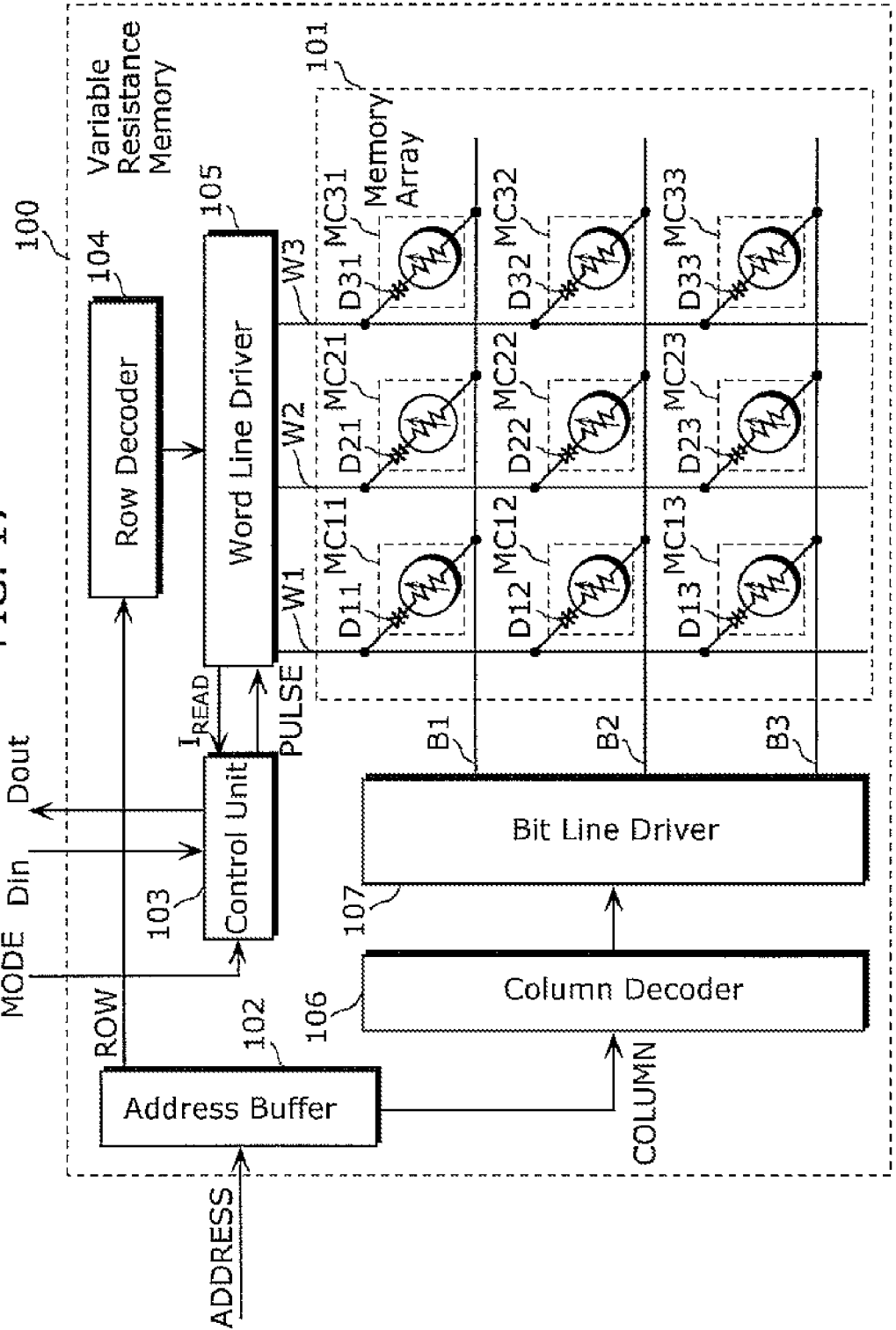
FIG. 17 is a block diagram illustrating an example of a structure of a (1D1R) variable resistance memory device according to the second embodiment of the present invention.

FIG. 17 is a block diagram illustrating an example of a structure of the variable resistance memory device 100 according to the third embodiment of the present invention.

The variable resistance memory device 100 includes a memory array 101, an address buffer 102, a control unit 103 (voltage pulse application device), a row decoder 104, a word line driver 105 (word line drive unit), a column decoder 106, and a bit line/plate line driver 107 (bit line drive unit). Here, a circuit including the address buffer 102, the control unit 103 (voltage pulse application device), the row decoder 104, the word line driver 105 (word line drive unit), the column decoder 106, and the bit line/plate line driver 107 corresponds a voltage pulse application device according to one of the aspects of the present invention which applies various voltage pulses to the variable resistance element.

As shown in FIG. 17, the memory array 101 includes a plurality of word lines (first lines) W1, W2, W3, . . . and a plurality of bit lines (second lines) B1, B2, B3, . . . . The word lines W1, W2, W3, are arranged in parallel extending in a first direction on a semiconductor substrate. The bit lines B1, B2, B3, . . . are arranged in parallel extending in a second direction on a plane in parallel to the main plane of the semiconductor substrate. Here, the bit lines B1, B2, B3, . . . are arranged above the word lines W1, W2, W3, . . . , three-dimensionally crossing the word lines W1, W2, W3, . . . .

At the three-dimensional crosspoints among the word lines W1, W2, W3, . . . and the bit lines B1, B2, B3, . . . , there are provided a plurality of memory cells MC11, MC12, MC13, MC21, MC22, MC23, MC31, MC32, MC33, . . . (hereinafter, referred to as "memory cells MC11, MC12, . . . ") in a matrix. In each of the memory cells MC, a variable resistance element is connected in series with a corresponding one of the current steering elements D11, D12, D13, D21, D22, D23, D31, D32, D33, . . . (bidirectional diodes, for example). In addition, each of the variable resistance elements is also connected to a corresponding one of the bit lines B1, B2, B3, . . . . Moreover, each of the current steering elements is connected to (a) a corresponding variable resistance element and (b) a corresponding one of the word lines W1, W2, W3, . . . . Each of the variable resistance elements is the variable resistance element according to the present invention, for example, the variable resistance element 10 according to the first embodiment of the present invention.

The address buffer 102 receives address signals ADDRESS from an external circuit (not shown), and then, based on the received address signals ADDRESS, provides row address signals ROW to the row decoder 104 and column address signals COLUMN to the column decoder 106. The address signals ADDRESS indicate an address of a memory cell selected from the memory cells MC11, MC12, . . . . The row address signals ROW indicate an address of a row of the address indicated in the address signals ADDRESS. The column address signals COLUMN indicate an address of a column of the address indicated in the address signals ADDRESS.

The control unit 103 selects one of a program mode and a readout mode, based on a mode selection signal MODE received from an external circuit. The program mode is a mode for selecting one of (a) a program mode for change to a low resistance state (namely, an erasing step) and (b) a program mode for change to a high resistance state (namely, a writing step), depending on a value of Din.

In the program mode, based on the input data Din received from an external circuit, the control unit 103 applies, to the word line driver 105, a write voltage pulse for change to a low resistance state or a write voltage pulse for change to a high resistance state.

In the readout mode, the control unit 103 applies a read voltage to the word line driver 105. In the readout mode, the control unit 103 further receives signals IREAD from the word line driver 105, and provides the external circuit with output data Dout indicating a bit value depending on the signals IREAD. The signals IREAD indicate a current value of current flowing in the word lines W1, W2, W3, . . . during the readout mode.

The row decoder 104 receives the row address signals ROW from the address buffer 102, and based on the row address signals ROW, selects one of the word lines W1, W2, W3, . . . .

Based on the output signal of the row decoder 104, the word line driver 105 applies an activation voltage, which is provided from the control unit 103, to the word line selected by the row decoder 104.

The column decoder 106 receives the column address signals COLUMN from the address buffer 102, and selects one of the bit lines B1, B2, B3, based on the column address signals COLUMN.

The bit line driver 107 sets the bit line selected by the column decoder 106, to be grounded, based on the output signal of the column decoder 106.

In the third embodiment, a set of the address buffer 102, the row decoder 104, and the word line driver 105 forms a first line selection device. In addition, a set of the address buffer 102, the column decoder 106, and the bit line driver 107 forms a second line selection device. Furthermore, a set of the address buffer 102, the row decoder 104, the word line driver 105, the column decoder 106, and the bit line driver 107 forms a memory cell selection device.

It should be noted that a circuit that is a combination of the control unit 103 and the word line driver 105 according to the third embodiment corresponds to each of the writing unit and the erasing unit included in the voltage pulse application device according to one of the aspects of the present invention.

[Operation]

Next, examples of operations performed by the crosspoint memory according to the third embodiment to perform a writing step for change to a high resistance state, an erasing step for change to a low resistance state, and a reading (readout) step. Here, since known methods can be used for selecting a bit line or a word line and for applying a voltage pulse, the methods are not described in detail below. In the following, it is assumed that the writing and reading steps are executed for the memory cell MC22.

[Writing Step for Change to High Resistance State]

When one bit data indicating "1" is to be programmed (written) to the memory cell MC22, the bit line driver 107 sets the bit line B2 to be grounded and the word line driver 105 electrically connects the word line W2 to the control unit 103. Then, the control unit 103 performs control to apply a write voltage pulse to the word line W2. Here, the initial writing step is set to have the voltage value Vw1 of −2.5 V and a pulse width of 100 nsec, and the subsequent writing steps are set to have the voltage value Vw of −1.8 V and a pulse width of 100 nsec, for example.

In the above-described writing step, a write voltage pulse is applied to the variable resistance element in the memory cell MC22. As a result, the variable resistance element in the memory cell MC22 is changed to a high resistance state represented by "1".

[Erasing Step for Change to Low Resistance State]

When one bit data indicating "0" is to be programmed to (erased from) the memory cell MC22, the bit line driver 107 sets the bit line B2 to be grounded and the word line driver 105 electrically connects the word line W2 to the control unit 103. Then, the control unit 103 performs control to apply an erasing voltage pulse to the word line W2. Here, the erasing voltage pulse is set to have the voltage value Ve of +1.5 V and a pulse width of 100 nsec, for example.

In the above-described erasing step, an erasing voltage pulse is applied to the variable resistance element in the memory cell MC22. As a result, the variable resistance element in the memory cell MC22 is changed to a low resistance state represented by "0".

[Reading Step]

When data is to be read out from the memory cell MC22, the bit line driver 107 sets the bit line B2 to be grounded and the word line driver 105 electrically connects the word line W2 to the control unit 103. Then, the control unit 103 performs-control to apply a readout voltage to the word line W2. Here, the readout voltage is set to have a voltage value of "+0.5 V", for example. When the readout voltage is applied to the memory cell MC22, current having a current value depending on a resistance value of the variable resistance element 10 in the memory cell MC22 flows between the bit line B2 and the word line W2.

The control unit 103 detects, via the word line driver 105, a current value of the current flowing between the bit line B2 and the word line W2, and thereby detects the resistance state of the memory cell MC22 based on the current value and the readout voltage.

If a resistance value of the variable resistance element in the memory cell MC22 is in a high resistance state "Rb", then it is determined that the memory cell MC22 is in a state represented by "1". On the other hand, if the resistance value of the variable resistance element 10 in the memory cell MC22 is in a low resistance state "Ra", then it is determined that the variable resistance element is in a state represented by "0".

In the above-described reading step, data is read out from the memory cell MC22.

It should be noted that the variable resistance memory device 100 according to the third embodiment of the present invention may have a function of "re-writing" described in the first embodiment. More specifically, the voltage pulse application device according to the third embodiment may include a circuit (re-writing unit) that performs the "re-writing" step described in the first embodiment. Likewise the writing unit and the erasing unit, the re-writing circuit is implemented as a combination of the control unit 103 and the word line driver 105.

Variation of Third Embodiment

It should be noted that the third embodiment provides a crosspoint memory device that is made of a single layer, but the crosspoint memory device may be made of multiple layers by stacking memory arrays. It should also be noted that the variable resistance element and the current steering element may be exchanged. More specifically, it is also possible that the word lines are connected to the variable resistance elements and the bit lines are connected to the current steering elements. It is further possible that the bit line or the word line also serves as an electrode of the variable resistance element.

It is assumed in the above description that data can be overwritten in the variable resistance element. However, if overwriting prevents the variable resistance element from correct operation, it is possible that a resistance state of the variable resistance element is detected prior to overwriting so as to determine whether or not to apply a write pulse. It is also possible that a resistance state of a target variable resistance element is set to be an initial state prior to a writing step, and then the writing step is performed only for the necessary target variable resistance element.

[Effects]

As described above, in the variable resistance memory device according to the third embodiment, an initial write voltage for increasing a resistance value from an initial state is set to be higher than general subsequent write voltages. Thereby, it is possible to achieve high-speed stable resistance variation with very good endurance characteristics. As a result, a variable resistance memory device with quite high reliability can be provided.

Although only some embodiments, examples, variations of the present invention have been described for the method of programming the variable resistance element and the variable resistance memory device using the method in detail above, those skilled in the art will be readily appreciate that many modifications and combinations of any structure elements in the exemplary embodiments, examples, and variations are possible without materially departing from the novel teachings and advantages of the present invention. Accordingly, all such modifications and combinations are intended to be included within the scope of this invention.

For example, although it has been described in the above embodiments that the pulse width of the various voltage pulses is set to be 100 nsec, the present invention is not limited to this. A narrower pulse width is also possible as far as the writing and erasing steps are performed with stability.

INDUSTRIAL APPLICABILITY

The method of programming the variable resistance element and the variable resistance memory device using the method according to the present invention enable the variable resistance element to be manufactured at ambient temperature and have very high reliability. Therefore, the variable resistance element and the variable resistance memory device can be useful as a nonvolatile memory element and a memory device using the memory element, respectively.

The invention claimed is:

1. A method of programming a variable resistance element, the variable resistance element being nonvolatile and including a variable resistance layer and first and second electrodes connected to the variable resistance layer, and the variable resistance layer comprising a metal oxide and changing between a high resistance state and a low resistance state depending on a polarity of an applied electric pulse, said method comprising:

writing to cause the variable resistance layer to change from the low resistance state to the high resistance state, by applying a write voltage pulse with a first polarity between the first and second electrodes; and erasing to cause the variable resistance layer to change from the high resistance state to the low resistance state, by applying an erasing voltage pulse with a second polarity different from the first polarity between the first and second electrodes, wherein said writing includes applying the write voltage pulse and the erasing voltage pulse between the first and second electrodes so as to satisfy $|Vw1|>|Vw|\geq|Ve|$ where Vw1 represents a voltage value of the write voltage pulse in an initial writing step after manufacturing the variable resistance element, Vw represents a voltage value of the write voltage pulse in writing steps after the initial writing step, and Ve represents a voltage value of the erasing voltage pulse after the initial writing step, the write voltage pulse in the initial writing step being applied to the variable resistance element in an initial state.

2. The method according to claim 1,
wherein said writing further includes (i) determining a resistance state of the variable resistance layer after each of the writing steps, and (ii) applying a re-write voltage pulse with a voltage value Vw2 between the first and second electrodes so as to satisfy $|Vw2|>|Vw|\geq|Ve|$ when said determining is made that the variable resistance layer remains in the low resistance state.

3. The method according to claim 2, wherein said writing includes applying the re-write voltage pulse between the first and second electrodes so as to satisfy $Vw1=Vw2.$ 4. The method according to claim 1, wherein the metal oxide is a tantalum oxide represented by a chemical formula of $TaO_x$ where $0.8\leq x\leq 1.9$.

5. A variable resistance memory device comprising: a variable resistance element that is nonvolatile; and a voltage pulse application device,
wherein said variable resistance element includes:
a variable resistance layer comprising a metal oxide and changing between a high resistance state and a low resistance state depending on a polarity of an applied electric pulse; and
first and second electrodes connected to said variable resistance layer, and
said voltage pulse application device includes:
a writing unit configured to cause said variable resistance layer to change from the low resistance state to the high resistance state, by applying a write voltage pulse with a first polarity between said first and second electrodes; and
an erasing unit configured to cause said variable resistance layer to change from the high resistance state the low resistance state, by applying an erasing voltage pulse with a second polarity different from the first polarity between said first and second electrode,
wherein said writing unit and said erasing unit are further configured to apply the write voltage pulse and the erasing voltage pulse, respectively, between said first and second electrodes so as to satisfy $|Vw1|>|Vw|\geq|Ve|$ where Vw1 represents a voltage value of the write voltage pulse in an initial writing step after manufacturing said variable resistance element, Vw represents a voltage value of the write voltage pulse in writing steps after the initial writing step, and Ve represents a voltage value of the erasing voltage pulse after the initial writing step, the write voltage pulse in the initial writing step being applied to said variable resistance element in an initial state.

6. The variable resistance memory device according to claim 5,
wherein said writing unit is further configured to (i) determine a resistance state of said variable resistance layer after each of the writing steps, and (ii) apply a re-write voltage pulse with a voltage value Vw2 between said first and second electrodes so as to satisfy $|Vw2|>|Vw|$ when the determining is made that said variable resistance layer remains in the low resistance state.

7. The variable resistance memory device according to claim 6,
wherein said writing unit is further configured to apply the re-write voltage pulse between said first and second electrodes so as to satisfy $Vw1=Vw2.$ 8. The variable resistance memory device according to claim 5,
   wherein the metal oxide is a tantalum oxide represented by a chemical formula of $TaO_x$ where $0.8 \leqq x \leqq 1.9$.

9. The variable resistance memory device according to claim 5, further comprising
   a current steering element electrically connected between said voltage pulse application device and one of said first and second electrodes.

10. The variable resistance memory device according to claim 9,
    wherein said current steering element is a transistor.

11. The variable resistance memory device according to claim 9,
    wherein said current steering element is a diode.

* * * * *